(12) United States Patent
Asghari

(10) Patent No.: US 8,965,208 B2
(45) Date of Patent: Feb. 24, 2015

(54) MULTI-CHANNEL OPTICAL DEVICE

(75) Inventor: Mehdi Asghari, San Marino, CA (US)

(73) Assignee: Kotura, Inc., Monterey Park, CA (US)

( * ) Notice: Subject to any disclaimer, the term of this patent is extended or adjusted under 35 U.S.C. 154(b) by 747 days.

(21) Appl. No.: 12/800,047

(22) Filed: May 6, 2010

(65) Prior Publication Data

US 2010/0296812 A1    Nov. 25, 2010

Related U.S. Application Data

(60) Provisional application No. 61/216,922, filed on May 22, 2009.

(51) Int. Cl.
| | |
|---|---|
| *H04J 14/02* | (2006.01) |
| *H01S 5/14* | (2006.01) |
| *G02B 6/12* | (2006.01) |
| *B82Y 20/00* | (2011.01) |
| *H01S 5/34* | (2006.01) |
| *H01S 5/10* | (2006.01) |
| *H01S 5/022* | (2006.01) |
| *G02B 6/293* | (2006.01) |

(52) U.S. Cl.
CPC ........... *G02B 6/12007* (2013.01); *H01S 5/3412* (2013.01); *H01S 5/141* (2013.01); *H01S 5/1071* (2013.01); *H01S 5/02248* (2013.01); *B82Y 20/00* (2013.01); *H01S 5/1003* (2013.01); *G02B 6/2931* (2013.01)
USPC ............................................. 398/82; 398/79

(58) Field of Classification Search
CPC .. B82Y 20/00; G02B 6/12007; G02B 6/2931; H01S 5/141; H01S 5/02248; H01S 5/1003; H01S 5/1071; H01S 5/3412

USPC ...................................................... 398/82, 79
See application file for complete search history.

(56) References Cited

U.S. PATENT DOCUMENTS

| | | | | |
|---|---|---|---|---|
| 5,178,617 | A | * | 1/1993 | Kuizenga et al. ................ 606/17 |
| 5,524,011 | A | * | 6/1996 | Lawandy ......................... 372/22 |
| 5,581,639 | A | | 12/1996 | Davies et al. |
| 6,067,391 | A | | 5/2000 | Land |
| 6,122,417 | A | | 9/2000 | Jayaraman et al. |
| 6,256,328 | B1 | * | 7/2001 | Delfyett et al. .................. 372/23 |

(Continued)

FOREIGN PATENT DOCUMENTS

| | | |
|---|---|---|
| WO | WO02/25705 | 3/2002 |
| WO | WO02/058200 | 7/2002 |
| WO | WO2008/080171 | 7/2008 |

OTHER PUBLICATIONS

Gubenko, A. et al., *Error-free 10 Gbit/s transmission using individual Fabry-Perot modes of low noise quantum-dot laser*, Electronics Letters, 6th, Dec. 2007, vol. 43, No. 25 (2 pgs).

(Continued)

*Primary Examiner* — Ken Vanderpuye
*Assistant Examiner* — Abbas H Alagheband
(74) *Attorney, Agent, or Firm* — Gavrilovich, Dodd & Lindsey, LLP

(57) ABSTRACT

The multi-channel optical device includes a demultiplexer in a laser cavity. The demultiplexer is configured to demultiplex a multi-channel light beam into a plurality of channels. The demultiplexer limits the wavelengths of the channels that are output from the laser cavity. The gain element includes quantum dots as the gain medium.

20 Claims, 14 Drawing Sheets

(56) References Cited

U.S. PATENT DOCUMENTS

| | | | |
|---|---|---|---|
| 6,498,666 B1* | 12/2002 | Asghari | 398/139 |
| 6,625,337 B2* | 9/2003 | Akiyama | 385/14 |
| 6,657,723 B2 | 12/2003 | Cohen et al. | |
| 6,724,512 B2* | 4/2004 | Carlson et al. | 359/244 |
| 6,803,604 B2* | 10/2004 | Takahashi et al. | 257/80 |
| 6,816,525 B2* | 11/2004 | Stintz et al. | 372/45.01 |
| 6,819,845 B2* | 11/2004 | Lee et al. | 385/122 |
| RE38,682 E | 1/2005 | Taylor | |
| 6,961,499 B2* | 11/2005 | Lee et al. | 385/122 |
| 7,005,669 B1* | 2/2006 | Lee | 257/21 |
| 7,020,372 B2* | 3/2006 | Lee et al. | 385/129 |
| 7,150,910 B2* | 12/2006 | Eisler et al. | 428/325 |
| 7,470,473 B2* | 12/2008 | Eisler et al. | 428/701 |
| 7,515,626 B2* | 4/2009 | Lee et al. | 372/71 |
| 7,542,641 B1 | 6/2009 | Asghari et al. | |
| 8,279,519 B2* | 10/2012 | Takahashi et al. | 359/344 |
| 2001/0033371 A1* | 10/2001 | Lawandy | 356/71 |
| 2002/0114367 A1* | 8/2002 | Stintz et al. | 372/45 |
| 2002/0159140 A1* | 10/2002 | Fan | 359/349 |
| 2002/0172239 A1* | 11/2002 | McDonald et al. | 372/20 |
| 2002/0176472 A1* | 11/2002 | Arbore et al. | 372/72 |
| 2002/0179929 A1* | 12/2002 | Takahashi et al. | 257/184 |
| 2002/0197013 A1* | 12/2002 | Liu et al. | 385/37 |
| 2003/0025962 A1 | 2/2003 | Nishimura | |
| 2003/0091265 A1* | 5/2003 | Lin et al. | 385/15 |
| 2004/0126072 A1* | 7/2004 | Lee et al. | 385/122 |
| 2004/0228564 A1* | 11/2004 | Gunn et al. | 385/1 |
| 2005/0018965 A1 | 1/2005 | Shen et al. | |
| 2005/0058415 A1* | 3/2005 | Lee et al. | 385/122 |
| 2005/0058416 A1* | 3/2005 | Lee et al. | 385/122 |
| 2006/0054899 A1* | 3/2006 | Takahashi et al. | 257/80 |
| 2006/0115269 A1 | 6/2006 | Shin et al. | |
| 2007/0002924 A1 | 1/2007 | Hutchinson et al. | |
| 2007/0165688 A1* | 7/2007 | Lee et al. | 372/71 |
| 2008/0013886 A1 | 1/2008 | Morris et al. | |
| 2008/0165819 A1* | 7/2008 | Lin et al. | 372/44.01 |
| 2008/0230764 A1* | 9/2008 | Burt | 257/12 |
| 2009/0146081 A1* | 6/2009 | Stark | 250/492.2 |

OTHER PUBLICATIONS

Kovsch A. et al., *Quantum-dot laser with 75 nm broad spectrum of emission*, Apr. 1, 2007/vol. 32, No. 7/Optics Letters, pp. 793-795.

Kovsch Alexey, *Quantum-dot comb laser with low relative noise intensity for each mode*, 2008, pp. 1-3, SPIE.

Park et al,. Multi-Wave Generation at 1.55 micrometer from an External Cavity Semiconductor Laser, Proceedings of the SPIE, vol. 4042, 2000, pp. 82-87.

Poguntke, K. R. et al., Design of a Multistripe Array Grating integrated Cavity (Magic) Laser; Journal of Lightwave Technology, vol. 11, No. 12, Dec. 1993; pp. 2191-2200.

Nyairo, K. O. et al., *Multichannel grating cavity (MGC) laser transmitter for wavelength division multiplexing applications*; IEE Proceedings-J, vol. 138, No. 5, Oct. 1991; pp. 337-342.

Shi, H. et al., 20 x 5 Gbit/S Optical WDM Transmitter Using Single Stripe Multiwavelength Modelocked Semiconductor Laser, Electronics Letters, IEE Stevenage, GB, vol. 34, No. 2, Jan. 22, 1988, pp. 179-181.

White, Ian H., *A Multichannel Grating Cavity Laser for Wavelength Division Multiplexing Applications*; Journal of Lightwave Technology, vol. 9, No. 7, Jul. 1991; pp. 893-899.

* cited by examiner

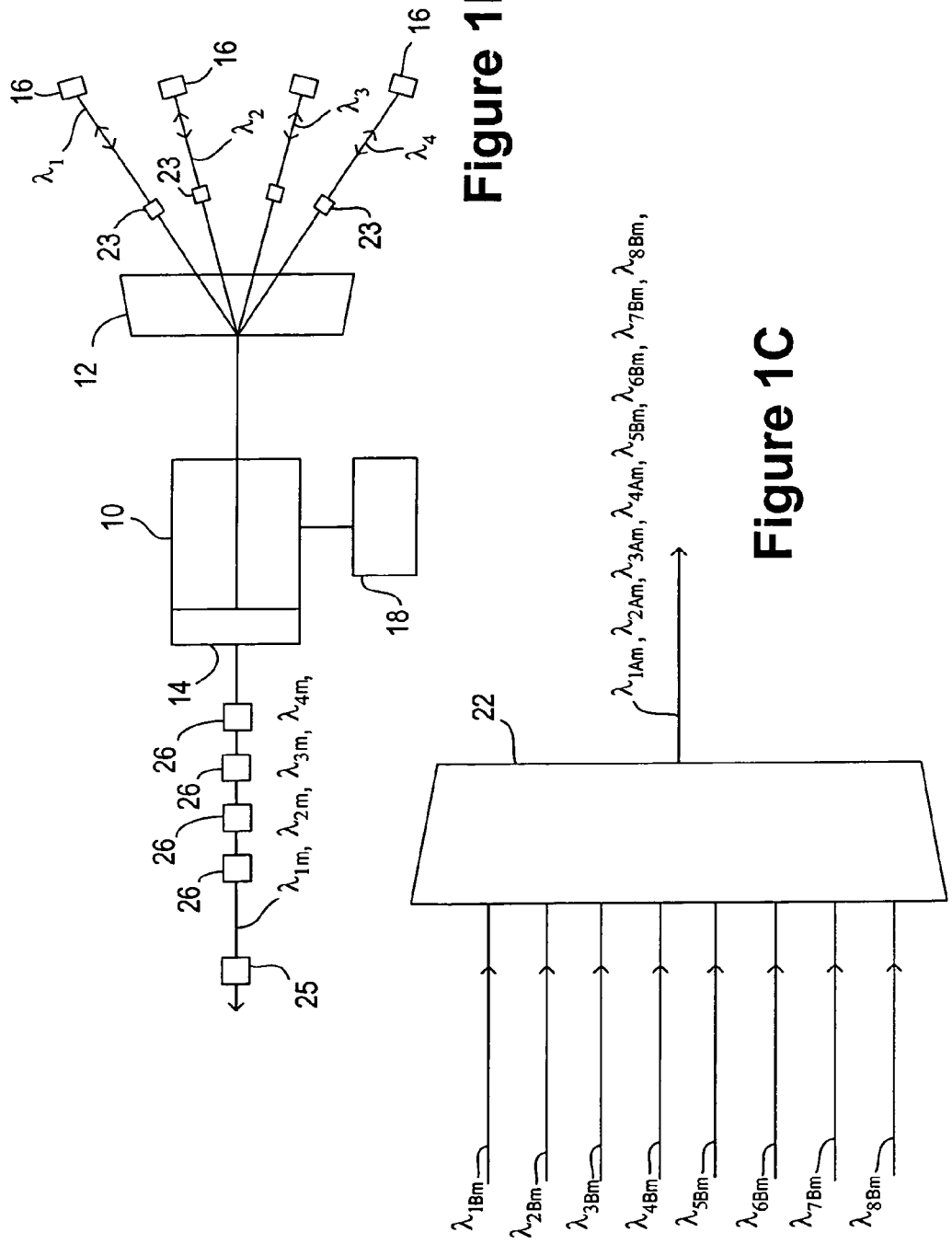

MULTI-CHANNEL OPTICAL DEVICE

RELATED APPLICATIONS

This Application claims the benefit of U.S. Provisional Patent Application No. 61/216,922, filed on May 22, 2009, entitled "Multi-Channel Optical Device," and incorporated herein in its entirety. This Application is related to U.S. patent application Ser. No. 11/998,846, filed on Nov. 30, 2007, entitled "Multi-Channel Optical Device," and incorporated herein in its entirety.

FIELD

The present invention relates to optical devices and more particularly to devices for generating multiple optical channels.

BACKGROUND

Optical communication systems employ waveguides to carry optical channels. The waveguides preferably carry a plurality of optical channels in order to increase the capacity of the system. These channels are generated by lasers. Fabry-perot (FP) lasers emit a broad range of wavelengths but the emission spectrum is not easily controlled. The spectrum changes with temperature and current and is not capable of high speed transmission or over long spans. In response, distributed feedback (DFB) lasers were generated. While DFB lasers are able to emit over a narrow spectrum they are only capable of generating a single wavelength channel. As a result, a plurality of DFB lasers are often employed to generate the desired number of channels. However, DFB lasers are substantially more expensive that FP lasers. As a result, using multiple DFB lasers can cause an undesirable increase in the cost of the system. As a result, there is a need for an economical optical device that can produce a plurality of channels such that each channel has a narrow range of wavelengths.

SUMMARY

A multi-channel optical device includes a gain element in a laser cavity. The gain element is configured to produce a multi-channel light beam. The gain element includes or consists of quantum dots that serve as a gain medium for the gain element. A demultiplexer is included in a laser cavity. The demultiplexer configured to demultiplex the multi-channel light beam into a plurality of channels.

BRIEF DESCRIPTION OF THE FIGURES

FIG. 1B is schematic view of a multi-channel device configured to produce light signals that each carry a different channel. Each light signal exits a laser cavity through the same port.

FIG. 1C illustrates combination of channels from different multi-channel devices.

FIG. 4A is a topview of the multi-channel device.

FIG. 4B is a cross section of the cavity waveguide shown in FIG. 4A taken along the line labeled B.

FIG. 4C is a cross section of the multi-channel device shown in FIG. 4A taken along a line extending between the brackets labeled C in FIG. 4A.

FIG. 4D is a cross section of the multi-channel device shown in FIG. 4A taken along a line extending between the brackets labeled D in FIG. 4A.

FIG. 5A is a topview of the multi-channel device.

FIG. 5B is a cross section of the multi-channel device taken along the line labeled B in FIG. 5A.

FIG. 6A is a topview of the multi-channel device. The coupler includes a channel waveguide and a coupled waveguide.

FIG. 6B is a cross section of the coupled waveguide and the channel waveguide taken along the line labeled B in FIG. 6A.

FIG. 6C is a cross section of the coupled waveguide taken along a line between the brackets labeled C in FIG. 6A.

FIG. 7A is a topview of the Mach-Zehnder interferometer. The Mach-Zehnder interferometer includes a channel waveguide that branches into a first branch waveguide and a second branch waveguide. The first branch waveguide re-joins the second branch waveguide at a modulated waveguide. A phase modulator is positioned along the second branch waveguide.

FIG. 7B is a topview of a phase modulator that is suitable for use with the Mach-Zehnder interferometer of FIG. 7A.

FIG. 7C is a cross section of the phase modulator shown in FIG. 7B taken along the line labeled C in FIG. 7B.

FIG. 7D through FIG. 7E illustrate the effects of tuning the phase modulator on the second branched waveguide.

DESCRIPTION

The multi-channel device includes a gain medium and a demultiplexer in a laser cavity. The gain medium is configured to produce a first multi-channel light beam that is received by the demultiplexer. The demultiplexer separates the multi-channel light beam into a plurality of channels. The channels are each received at a first reflector that returns at least a portion of each channel to the demultiplexer. The demultiplexer combines the returned channels into a second multi-channel light beam that is returned to the gain medium. The second multi-channel light beam can travel through the gain medium and form a third multi-channel light beam that is received at a second reflector that returns at least a portion of the third multi-channel light beam to the gain medium. The returned portion of the third multi-channel light beam can travel through the gain medium to form the first multi-channel light beam.

The first reflectors and/or the second reflector can be partial reflectors. As a result, the output of the laser cavity can exit from the first reflector and/or from the second reflector.

As the channels travel back and forth between the first reflectors and the second reflector, the channels travel through the gain medium where they are amplified and lase. Since the wavelengths outside the channels have a high level of loss due to the demultiplexer, these wavelengths are not amplified and do not lase. The Gaussian nature of the demultiplexer results in lasing of a narrower range wavelengths than would be produced by the gain medium in the absence of the demultiplexer.

The gain medium is a quantum dot gain medium configured to produce a variety of different wavelengths. When a non-quantum dot gain medium is used, the different channels compete for lasing within the gain medium. The competition between the different channels results in different channels having different intensities relative to one another. While attenuators can be positioned in the laser cavity in order to reduce this competition, this arrangement has proven difficult to stabilize. The Applicant has surprisingly found that when a quantum dot gain medium is used, the competition between different channels is reduced or even eliminated. As a result, the use of the quantum dot gain medium can stabilize the output from the device.

Figure 1A:
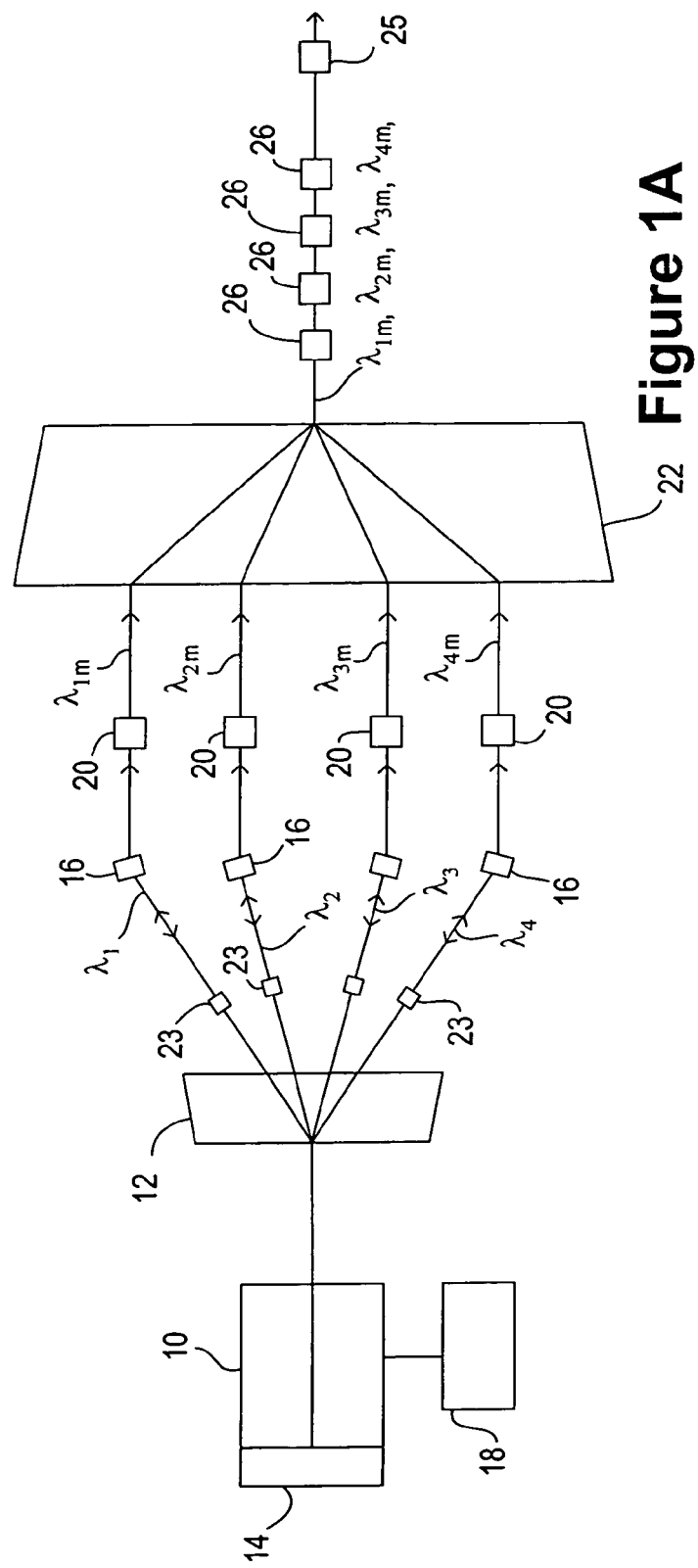
FIG. 1A is schematic view of a multi-channel device configured to produce light signals that each carry a different channel. Each light signal exits a laser cavity through a different port.

FIG. 1A is a schematic diagram of a multi-channel device. The multi-channel device includes a gain medium 10 and a demultiplexer/multiplexer (demultiplexer 12) optically positioned between a second reflector 14 and first reflectors 16. As will be described in more detail below, the gain medium is a quantum dot gain element. Suitable demultiplexers include, but are not limited to, echelle gratings, AWG demultiplexers, transmission gratings, reflection gratings and other dispersive elements. The second reflector 14 is preferably highly reflective or even 100% reflective. Suitable second reflectors 14 include, but are not limited to, mirrors, reflective metals, partially or fully metal coated waveguide facets. The first reflectors 16 are partially reflective. For instance, the first reflectors 16 are configured to return a portion of a light signal along its original path and to permit another portion of the light signal to travel along a different path. Suitable first reflectors 16 include, but are not limited to, partially reflective surfaces, optical couplers where the coupled waveguide 44 has a reflective facet, partially etch facets, and narrow etched gaps. As will be described in more detail below, the second reflector 14 and the first reflectors 16 define a laser cavity.

During operation of the multi-channel device, the gain medium 10 receives energy from a power source 18. The energy received from the power source can be optical or electrical. In response to receiving the energy, the gain medium emits a multi-channel light beam having wavelengths over a broad range of wavelength as defined by the material properties of the gain medium. The beam is received at a demultiplexer. The demultiplexer separates the beam into a set of channels where each channel includes a range of wavelengths. The channels are illustrated in FIG. 1A as $\lambda_1$, $\lambda_2$, $\lambda_3$, and $\lambda_4$. Wavelengths outside of the channels are blocked by the demultiplexer by virtue of experiencing a high level of loss caused by the demultiplexer. As a result, the demultiplexer provides the laser cavity with wavelength selectivity.

The channels $\lambda_1$, $\lambda_2$, $\lambda_3$, $\lambda_4$ are each received at a different one of the first reflectors 16. Each first reflector 16 is configured to return a first portion of a received channel to the demultiplexer 12. The demultiplexer 12 multiplexes the portion of the channels returned from the first reflectors 16. Accordingly, the demultiplexer 12 also operates as a multiplexer. The gain medium 10 receives the multiplexed channels from the demultiplexer 12. The second reflector 14 can receive the returned channels from the gain medium 10. The returned channels are reflected off the second reflector 14 and back through the gain medium 10. Accordingly, the channels travel back and forth between the second reflector 14 and the first reflector 16.

As the channels travel back and forth between the second reflector 14 and the first reflectors 16 the channels travel through the gain medium where they are amplified and lase. Since the wavelengths outside the channels have a high level of loss due to the demultiplexer, these wavelengths are not amplified and do not lase.

As noted above, the first reflectors 16 each return a first portion of a channel to the demultiplexer 12. A second portion of each channel exits the laser cavity through a first reflector 16. Accordingly, the first reflectors 16 each include a port through which the channels exit the laser cavity. Channels that exit the laser cavity serve as the output of the laser.

The first reflectors can optionally be tunable. For instance, the first reflectors can be tuned such that the ratio of the first portion of a channel to the second portion of a channel can be tuned. Accordingly, tuning of a first reflector can increase or decrease the power of a particular channel output by the laser. As a result, the first reflectors can be tuned so as to balance the power of different channels.

The multi-channel device can optionally include optical attenuators positioned in the laser cavity. The optical attenuators 23 can be positioned such that each optical attenuator is configured to attenuate the intensity of one of the channels. For instance, each optical attenuator can be positioned optically between the demultiplexer 12 and the first reflector 16 for a channel to be attenuated by the optical attenuator. One or more of the optical attenuators can be tunable. In one example, all of the optical attenuators are tunable. For instance, one or more of the optical attenuators can be a variable optical attenuator. Tunability of the optical attenuators 23 permits balancing of the power of the different channels to compensate for loss or gain bias inside the laser cavity. The use of a quantum dot gain medium can reduce or even eliminate the need to positioning the optical attenuators 23 in the laser cavity. As a result, the optical attenuators may be optional.

The wavelengths included in the channels $\lambda_1, \lambda_2, \lambda_3, \lambda_4$ can be tuned. For instance, the demultiplexer 12 can be a tunable demultiplexer. Tuning the demultiplexer tunes the wavelength of each channel. An example of a suitable tunable AWG demultiplexer is presented in U.S. patent application Ser. No. 09/945,685, filed on Apr. 30, 2001, entitled "Tunable Filter," and now U.S. Pat. No. 6,853,773 and in U.S. patent application Ser. No. 09/993,337, filed on Nov. 13, 2001, entitled "Optical Component Having a Light Distribution Component With an Index of Refraction Tuner," each of which is incorporated herein in its entirety. The tuning principles disclosed in these applications can also be applied to other demultiplexers such as echelle gratings.

The multi-channel device can optionally include modulators 20 positioned outside of the laser cavity. In instances where the multi-channel device includes modulators 20, each modulator 20 receives the portion of a channel transmitted by a first reflector 16. The modulator 20 can be an intensity modulator such as monolithically integrated silicon modulator or other type of modulators hybridized into a silicon platform. The modulator could also be an intensity modulator that includes a phase modulator. For instance, the modulator could also be a phase modulator used within a Mach-Zehnder structure. The modulators 20 permit independent modulation of each channel. Additionally, the presence of the modulators 20 means that the laser can be a continuous wave laser that does not need its own modulation. Since the laser does not need its own modulation, the length of the laser cavity does not substantially affect the output of the multi-channel device.

The modulators 20 each output a modulated channel, $\lambda_{1m}$, $\lambda_{2m}$, $\lambda_{3m}$, $\lambda_{4m}$. A multiplexer 22 receives the modulated channels and multiplexes them to provide an output beam that contains each of the modulated channels, $\lambda_{1m}$, $\lambda_{2m}$, $\lambda_{3m}$, $\lambda_{4m}$. Suitable multiplexers 22 include, but are not limited to, echelle gratings, AWG multiplexers, transmission gratings, reflection gratings or other dispersive elements.

The multi-channel device can optionally include second optical modulators 26 positioned to receive the output of the multiplexer 22. The second optical modulators 26 can be used in addition to the modulators 20 or as an alternative to the modulators 20. Alternatively, the multi-channel device can exclude both the second optical modulators 26 and the modulators 20.

Each one of the second optical modulators 26 can be tuned to modulate a different one of the channels. As a result, the second optical modulators 26 permit each of the channels to be modulated after the channels have been multiplexed. A suitable example of a modulator that can be tuned to modulate a particular channel is a ring resonator.

The multi-channel device can optionally include an optical amplifier 25 configured to amplify the modulated optical signals after they are multiplexed at the multiplexer 22. As a result, the optical amplifier can concurrently amplify all of the channels. When the multi-channel includes an optical amplifier 25 and second optical modulators 26, the optical amplifier 25 can be positioned before the second optical modulators 26 or the second optical modulators 26 can be positioned before the optical amplifier 25.

The modulators 20, multiplexer 22, amplifier 25, and second optical modulators 26 are optional. For instance, the channels that exit the first reflectors 16 can be routed to other devices through optical fibers and/or waveguides and/or can be routed to other components on the multi-channel device. Since these other components may make use of the channels individually, there may be no need to multiplex those channels after they exit the first reflectors 16.

Although FIG. 1A discloses the first reflectors 16 as partial return devices and the second reflector as highly reflective, the first reflectors 16 can be highly reflective and the second reflector can be a partial return device. For instance, the first reflectors 16 can be highly reflective or even 100% reflective. In this instance, suitable first reflectors 16 include, but are not limited to, mirrors, reflective metals, partially or fully metal coated waveguide facets. The second reflector 14 can be partially reflective. For instance, the second reflector 14 can be configured to return a portion of a light signal along its original path and to permit another portion of the light signal to travel along a different path. In this instance, a suitable second reflector 14 includes, but is not limited to, partially reflective surfaces, optical couplers where the coupled waveguide has a reflective facet, partially etched facets, and narrow etched gaps.

FIG. 1B is a schematic diagram of a multi-channel device where the first reflectors 16 can be highly reflective and the second reflector can be a partial return device. As described above, the second reflector 14 and the first reflectors 16 define a laser cavity. Since the second reflector 14 returns a first portion of a channel to the gain medium 10, a second portion of each channel exits the laser cavity through a first reflector 16. Accordingly, the second reflector 14 includes a port through which the channels exit the laser cavity. The exiting channels serve as the output of the laser.

The multi-channel device of FIG. 1B can optionally include optical attenuators positioned in the laser cavity. The optical attenuators 23 can be positioned such that each optical attenuator is configured to attenuate the intensity of one of the channels. For instance, each optical attenuator can be positioned optically between the demultiplexer 12 and the first reflector 16 for a channel to be attenuated by the optical attenuator. One or more of the optical attenuators can be tunable. In one example, all of the optical attenuators are tunable. For instance, one or more of the optical attenuators can be a variable optical attenuator. Tunability of the optical attenuators 23 permits balancing of the power of the different channels to compensate for loss or gain bias inside the laser cavity. The use of a quantum dot gain medium can reduce or even eliminate the need to positioning the optical attenuators 23 in the laser cavity. As a result, the optical attenuators 23 may be optional.

The multi-channel device can optionally include second optical modulators 26 positioned to receive the output of the multiplexer 22. Each one of the second optical modulators 26 can be tuned to modulate a particular one of the channels. As a result, the second optical modulators 26 permit each of the channels to be modulated after the channels have been multiplexed. A suitable example of a modulator that can be tuned to modulate a particular channel is a ring resonator. A suitable ring resonator is disclosed in U.S. patent application Ser. No. 12/228,671, filed on Aug. 13, 2008, entitled "Electrooptic Silicon Modulator with Enhanced Bandwidth," and incorporated herein in its entirety.

The multi-channel device can optionally include an optical amplifier 25 configured to amplify the modulated optical signals after they are multiplexed at the multiplexer 22. As a result, the optical amplifier can concurrently amplify all of the channels. When the multi-channel includes an optical amplifier 25 and second optical modulators 26, the optical amplifier 25 can be positioned before the second optical modulators 26 or the second optical modulators 26 can be positioned before the optical amplifier 25.

Although FIG. 1A and FIG. 1B each illustrates either the first reflectors 16 or the second reflectors 14 as being partial return devices, a multi-channel device can have both the first reflectors 16 and the second reflectors 14 as partial return devices. As a result, the multi-channel device can generate output through both the first reflectors 16 and the second reflectors 14.

Although the second reflector in FIGS. 1A and 1B is shown as contacting the gain medium, the second reflector can be spaced apart from the gain medium.

Although the multi-channel devices of FIG. 1A and FIG. 1B are illustrated as producing only four channels, the multi-channel device can be configured to produce more than four channels or fewer than four channels. The modulated channels or unmodulated channels from several different multi-channel devices can be multiplexed to further increase the number of channels. For instance, the modulated channels labeled $\lambda_{1m}$, through $\lambda_{4m}$ in FIG. 1A could originate from a first gain medium 10 and/or a first laser cavity while the channels labeled $\lambda_{1m}$, through $\lambda_{8m}$ in FIG. 1B could originate from a second gain medium 10 and/or from a second laser cavity. The multiplexer 22 multiplexes the channels from both gain media to form a beam having channels $\lambda_{1m}$ through $\lambda_{8m}$. Alternately, the multiplexer 22 multiplexes the channels from different laser cavities to form a beam having channels $\lambda_{1m}$ through $\lambda_{8m}$. Additionally, more than one multiplexer can be employed to multiplex channels from different laser cavities. For instance, cascaded multiplexers can be employed to multiplex channels from different laser cavities. When one or more multiplexers the multiplexer 22 multiplexes the channels from different laser cavities, the different laser cavities and the one or more multiplexers can be included on the same multi-channel device.

The gain medium used in the multi-channel device is a quantum dot gain element or a quantum dot gain medium. Quantum dots are semiconductors, which are crystals of group II-VI, III-V, or IV-VI materials. However, quantum dots have a smaller size than bulk semiconductors. For instance, quantum dots can be about 2-10 nanometers in diameter or about 10-50 atoms in diameter. As a result, quantum dots have been called nanocrystals. Unlike bulk semiconductors, small changes to the size of quantum dot can change the wavelength of the photons released from the quantum dots. For instance, the addition or subtraction of one or two atoms to the quantum dot can change the wavelength of the photons released from the quantum dots. In contrast, the addition or subtraction of one or two atoms to bulk semiconductor materials does not alter the wavelength of the photons released from the bulk semiconductor material.

Quantum dots also tend to show quantum confinement which is absent from bulk semiconductor materials. Quantum confinement occurs when the size of a semiconductor material approaches that material's Exiton Bohr radius. At this size, the electron energy levels in the semiconductor can no longer be treated as continuous and are instead discrete energy levels.

The relationship between the size of a quantum dot and the wavelength of the photons released by the quantum dot allows for particular wavelengths to be achieved by using quantum dots of a particular size in the gain medium. Additionally, quantum dots constructed from different semiconductor materials can generate different wavelengths even when they are about the same size. These features allow quantum dots to produce photons having wavelengths that are outside the range of wavelengths that can normally be achieved with bulk semiconductor materials.

A gain element for a standard semiconductor laser typically includes a bulk semiconductor gain medium. The gain element for a quantum dot laser generally includes a gain medium that includes quantum dots of different sizes and/or of different materials. For instance, one type of a quantum dot gain medium is constructed of multiple layers with different layers of material where each layer has quantum dots of a different size and/or material than the neighboring layer(s).

Figure 2A:
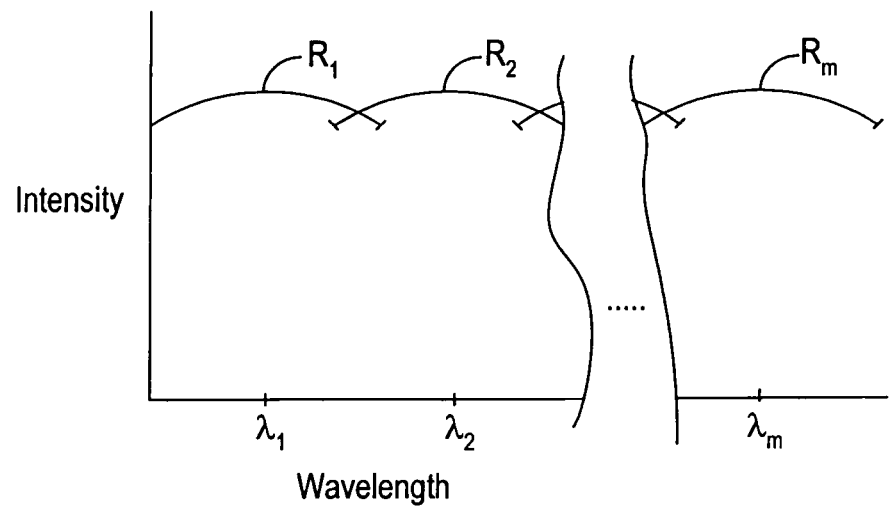
FIG. 2A is a possible intensity versus wavelength spectrum for the output of a quantum dot gain medium having quantum dots of radius R1, R2, . . . Rm.

The presence of quantum dots having different sizes and/or materials in the gain element causes the gain element to concurrently produce light signals of different wavelengths. For instance, FIG. 2A illustrates a possible intensity versus wavelength spectrum for the output of a quantum dot gain medium having quantum dots of radius R1, R2, . . . Rm. As is evident from FIG. 2A, each size of quantum dot is associated with a gain peak at a particular wavelength.

FIG. 2A illustrates each gain peak having about the same intensity. The intensities of different peaks relative to one another can be adjusted by adjusting the relative amounts of the quantum dots that are responsible for each gain peak in the gain medium.

Figure 2B:
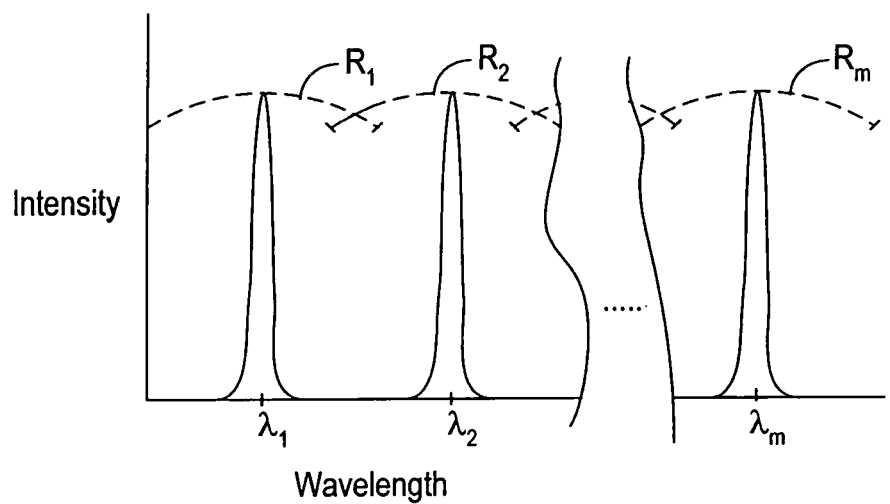
FIG. 2B is an intensity versus wavelength spectrum for a laser having a demultiplexer in the laser cavity when the gain medium is a quantum dot gain medium that results in an intensity versus wavelength spectrum according to FIG. 2A.

The presence of the demultiplexer in the laser cavity suppresses the lasing of particular wavelengths and accordingly controls the wavelengths that are output from the laser cavity. For instance, when the wavelengths selected by the demultiplexer are matched to the gain peaks of the gain medium, the output of the laser cavity can have an intensity versus wavelength spectrum according to FIG. 2B. In FIG. 2B, the dashed lines represent the gain peaks that would occur in the absence of a demultiplexer in the laser, cavity.

Figure 2C:
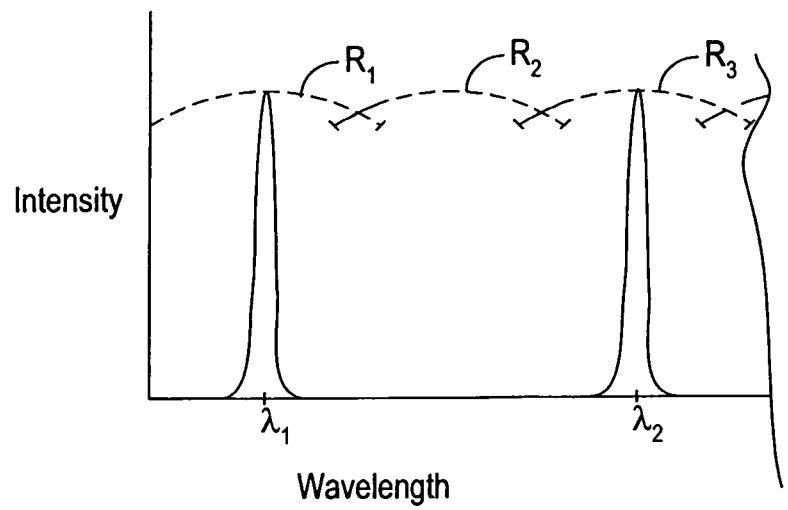
FIG. 2C is an intensity versus wavelength spectrum for a laser having a demultiplexer in the laser cavity when the gain medium is a quantum dot gain medium that results in an intensity versus wavelength spectrum according to FIG. 2A. Quantum dots having radius $R_2$ are not the dominant source of the light for any of the channels output from the laser cavity.

Since the demultiplexer in the laser cavity selects the wavelengths of the channels output by the laser cavity, each of the channels is not necessarily associated with a gain peak. For instance, FIG. 2C shows an intensity versus wavelength spectrum where one of the gain peaks does not result in a channel being output from the laser cavity. For instance, the quantum dots having radius $R_2$ are not the dominant source of the light for any of the channels output from the laser cavity. In FIG. 2C, the dashed lines represent the gain peaks that would occur in the absence of a demultiplexer in the laser cavity. This arrangement allows the separation between the channels to be increased above the separation that is provided by the gain medium itself. For instance, the current separation is about 0.2 nm. The use of the demultiplexer in the laser cavity allows this separation to be increased without reducing the power of the output. Additionally, the increased separation can increase the thermal and wavelength stability of the device.

Figure 2D:
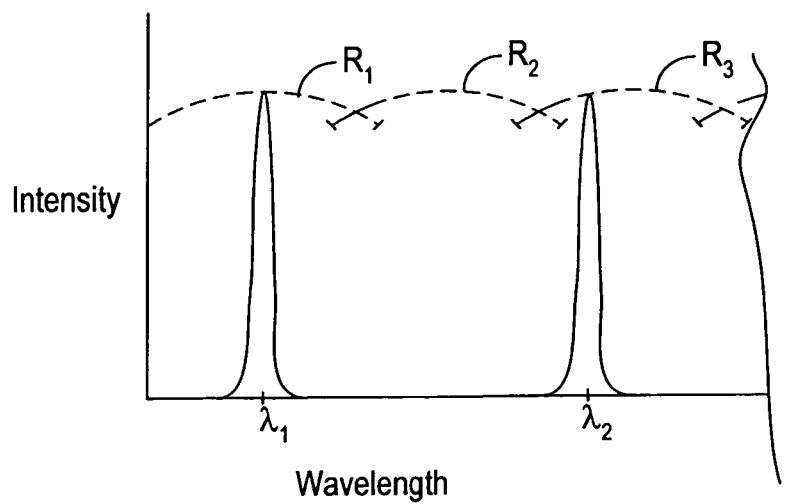
FIG. 2D is an intensity versus wavelength spectrum for a laser having a demultiplexer in the laser cavity when the gain medium is a quantum dot gain medium that results in an intensity versus wavelength spectrum according to FIG. 2A. The channel $\lambda_2$ has a wavelength that is not located at the peak of the gain spectrum associated with quantum dots having radius $R_3$

Since the demultiplexer selects the wavelength of the channels, in some instances, all or a portion of the channels are at a wavelength that does not correspond to the wavelength of a gain peak. For instance, FIG. 2D shows an intensity versus wavelength spectrum where the channel $\lambda_2$ has a wavelength that is not located at the peak of the gain spectrum associated with quantum dots having radius $R_3$. In contrast, the channel $\lambda_1$ has a wavelength located at the peak of the gain spectrum associated with quantum dots having radius $R_1$. If each of the gain peaks is at about the same intensity, this arrangement can cause channel $\lambda_1$ to have more intensity than channel $\lambda_2$. In the event that this is undesirable, the gain medium can be constructed such that the gain peak for associated with quantum dots having radius $R_3$ is at an increased intensity in order to increase the intensity of the channel $\lambda_2$. Additionally or alternately, the attenuators 23 can be employed to balance the intensity of the different channels to the desired levels.

Although FIG. 2D illustrates the wavelengths of the gain peaks as being periodic, this arrangement is not necessary and the wavelengths of the gain peaks may be non-periodic.

FIG. 2B through FIG. 2D shows that each gain peak that results in a channel being produced by the laser cavity results in only one channel being produced by the laser cavity. However, the demultiplexer in the laser cavity can optionally be configured such that one or more gain peaks each results more than one channel being produced by the laser cavity. However, it is preferred that each gain peak that results in a channel being produced by the laser cavity results in only one channel being produced by the laser cavity in order to reduce competition between the channels.

Figure 3A:
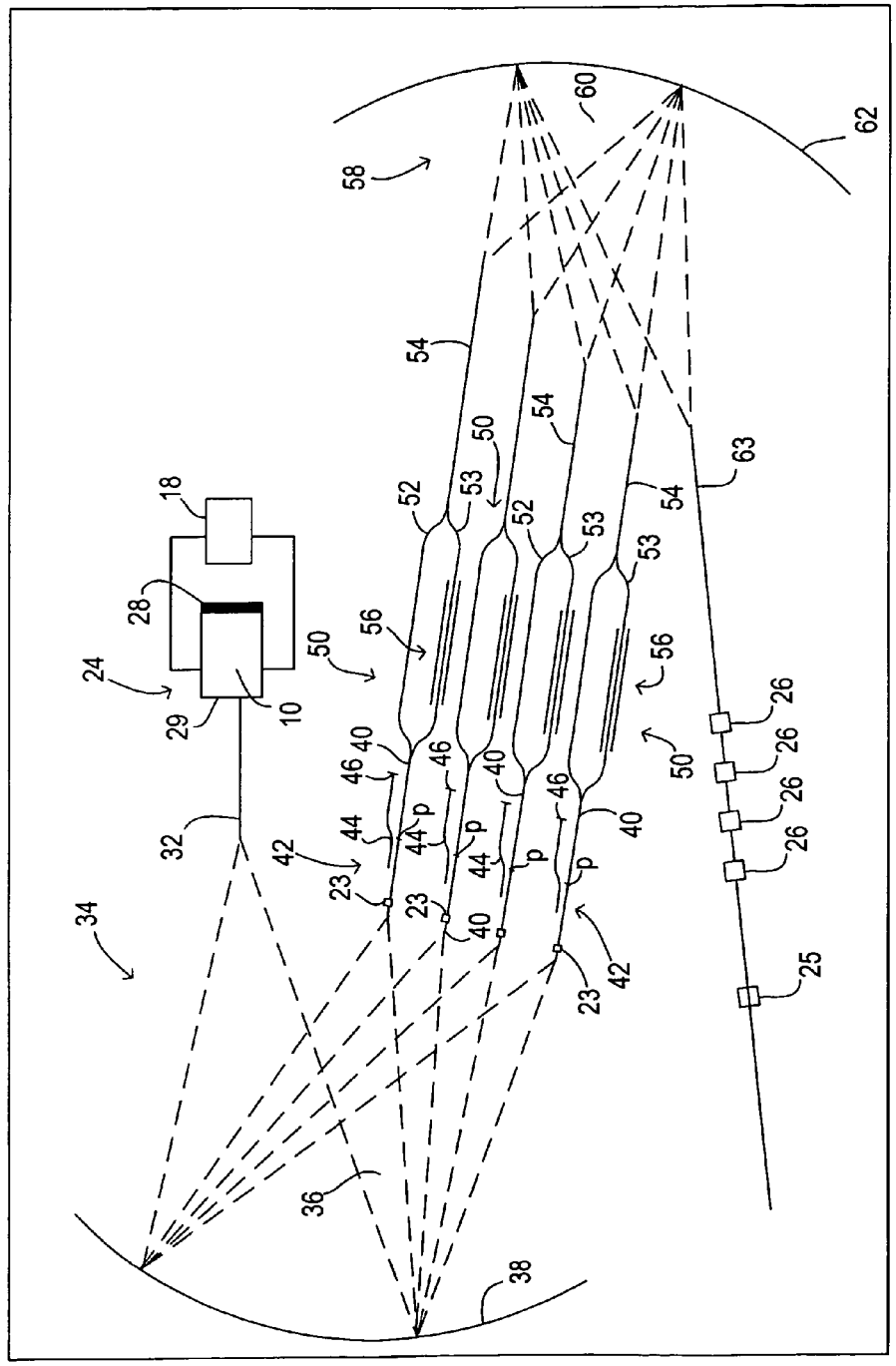
FIG. 3A illustrates a multi-channel device constructed according to FIG. 1A.

FIG. 3A illustrates a layout of a multi-channel device according to FIG. 1A. The illustrated multi-channel is suitable for use in conjunction with optical components. The multi-channel device employs a gain element 24 that includes the gain medium 10 of FIG. 1A. The gain element 24 has a reflecting surface 28 that serves as the second reflector 14 of FIG. 1A. The opposing surface includes an anti-reflective coating 29. The multi-channel device employs an electrical power source 18 to pass a current through the gain medium 10 and generate the light beam. The beam exits the gain medium 10 through the surface with the anti-reflective coating 29 and enters a cavity waveguide 32.

The multi-channel device of FIG. 3A employs an echelle grating 34 as the demultiplexer 12 of FIG. 1A. The echelle grating 34 includes a free space region 36 and a reflecting surface 38. The beam from the cavity waveguide 32 enters the free space region 36 of the echelle grating 34. The path of the light through the echelle grating 34 is illustrated as dashed lines in FIG. 3A in order to distinguish the light from other features of the multi-channel device. The beam travels through the free space region 36 and is reflected off of the reflecting surface 38. The details of the reflecting surface 38 are not shown in order to simplify the illustration. However, the reflecting surface 38 of an echelle grating 34 includes a plurality of stepped reflecting surfaces. The reflecting surface 38 causes light of different wavelengths to separate as they travel away from the reflecting surface 38. Accordingly, the echelle grating 34 demultiplexes the beam into the individual channels traveling away from the reflecting surface 38. The channels are each received on a channel waveguide 40.

The multi-channel device of FIG. 3A employs an optical coupler 42 as the first reflector 16 of FIG. 1A. Each coupler 42 couples a channel waveguide 40 with a coupled waveguide 44. The coupler 42 is constructed such that a portion of the channel traveling along a channel waveguide 40 is coupled into the associated coupled waveguide 44. The coupled waveguide 44 includes a reflecting device 46 that causes at least a portion of the channel to travel back along the coupled waveguide 44 into the channel waveguide 40 and back to the demultiplexer 12 of FIG. 1A and FIG. 1B and accordingly the gain medium 10 of FIG. 1A and FIG. 1B. A suitable reflecting device 46 includes, but is not limited to, a partially or completely reflecting surface at the end of the coupled waveguide 44.

The coupler 42 controls the portion of a channel returned to the gain medium 10. For instance, increasing the potion of the channel coupled into the coupled waveguide 44 can increase the portion of the channel returned to the gain medium 10. As a result, the couplers 42 should be configured to return enough of each channel to the gain medium 10 to achieve the desired level of lasing. The portion of a channel coupled into the coupled waveguide 44 can be controlled by changing the separation between a coupled waveguide 44 and the associated channel waveguide 40. For instance, reducing the distance between a coupled waveguide 44 and the associated channel waveguide 40 increases the portion of the channel that enters the coupled waveguide 44. In some instances, the portion of a channel coupled into the coupled waveguide 44 can also be controlled by changing the length for which the channel waveguide 40 and the coupled waveguide 44 are close enough to each share the channel. In some instances, increasing this length can increase the portion of the channel that is coupled into the coupled waveguide 44.

A portion of a channel traveling through a coupler 42 can be returned to the gain medium 10 as long as the channel is optically coupled into the coupled waveguide 44. The region of the channel waveguide 40 where a channel traveling along the channel waveguide 40 is no longer coupled into the coupled waveguide 44 serves as a port through which the channel exits the laser cavity. For instance, the lines labeled P in FIG. 3A can indicate where the channels exit the laser cavity through the port.

The multi-channel device of FIG. 3A employs a Mach-Zehnder interferometers 50 as the modulators 20 of FIG. 1A. The Mach-Zehnder interferometer 50 includes a first branch waveguide 52 and a second branch waveguide 53. A portion of a channel traveling along a channel waveguide 40 enters the first branch waveguide 52 and another portion of the channel enters the second branch waveguide 53. The first branch waveguide 52 and the second branch waveguide 53 join together at a modulated waveguide 54. The second branch waveguide 53 includes a phase modulator 56. The phase modulator 56 can be employed to tune a phase differential between the portion of the channel in the first branch waveguide and the portion of the channel in the second branch waveguide when they are joined at the modulated waveguide 54. Accordingly, the Mach-Zehnder interferometer 50 can operate as an intensity modulator.

The multi-channel device of FIG. 3A can optionally employ a ring resonator as each second optical modulator 26 of FIG. 1A. A suitable ring resonator is disclosed in U.S. patent application Ser. No. 12/228,671, filed on Aug. 13, 2008, entitled "Electrooptic Silicon Modulator with Enhanced Bandwidth," and incorporated herein in its entirety.

The multi-channel device of FIG. 3A employs an echelle grating 58 as the multiplexer 22 of FIG. 1A. The echelle grating 58 includes a free-space region 60 and a reflecting surface 62. The modulated channels from the modulated waveguides 54 enter the free space region 60 of the echelle grating 58. The path of the light through the echelle grating 58 is illustrated as dashed lines in FIG. 3A in order to distinguish the light from other features of the multi-channel device. The channels travel different paths through the free space region 60 to the reflecting surface 62 where they are reflected. The details of the reflecting surface 62 are not shown in order to simplify the illustration. However, the reflecting surface of echelle grating 58 includes a plurality of stepped reflecting surfaces. The reflecting surface causes the channels to be combined as they travel away from the reflecting surface. Accordingly, the echelle grating 58 multiplexes the beam into a multi-channel beam traveling away from the reflecting surface. The channels are each received on an output waveguide 63.

As noted above, the multi-channel device can optionally include optical attenuators positioned in the laser cavity. FIG. 3A illustrates an optical attenuator 23 positioned along each channel waveguide. Accordingly, an optical attenuator can be employed to attenuate a channel traveling along a channel waveguide. The optical attenuators are positioned in the laser cavity. For instance, the optical attenuators are each positioned optically between the demultiplexer and the first reflectors.

As noted above, the multi-channel device can optionally include an optical amplifier 25 configured to amplify the modulated optical signals after they are multiplexed at the multiplexer 22. FIG. 3A illustrates an optical amplifier 25 positioned along the output waveguide 63. Accordingly, the amplifier can be configured to amplify the modulated optical signals after they are multiplexed at the multiplexer 22.

The optical attenuators 23 can be positioned such that each optical attenuator is configured to attenuate the intensity of one of the channels. For instance, each optical attenuator can be positioned optically between the demultiplexer 12 and the first reflector 16 for a channel to be attenuated by the optical attenuator. One or more of the optical attenuators can be tunable. In one example, all of the optical attenuators are tunable. Tunability of the optical attenutors permits balancing of the power of the different channels to compensate for loss or gain bias inside the laser cavity. In general, the channels having the highest and lowest wavelengths ($\lambda_1$ and $\lambda_4$ in FIG. 1A and FIG. 1B) to see lower gains and higher losses. The attenuators can be employed to increase the loss for the channels with the central wavelengths ($\lambda_2$ and $\lambda_3$ in FIG. 1A and FIG. 1B). Placement of the optical attenuators in the lasing cavity permits a redistribution of power to take place in the laser cavity such that losses introduced to the channels with the central wavelengths causes a redistribution of gain medium power to the channels having the highest and lowest wavelengths. As a result, a higher average power can be achieved. The redistribution of power may not be achieved when optical attenuators are positioned outside of the laser cavity.

The multi-channel device can optionally include an optical amplifier 25 configured to amplify the modulated optical signals after they are multiplexed at the multiplexer 22. As a result, the optical amplifier can concurrently amplify all of the channels.

Although the multi-channel device of FIG. 3A illustrates the power source 18 included in the multi-channel device, the power source 18 can be separate from the multi-channel device and the multi-channel device can be configured to be coupled with the power source 18.

Figure 3B:
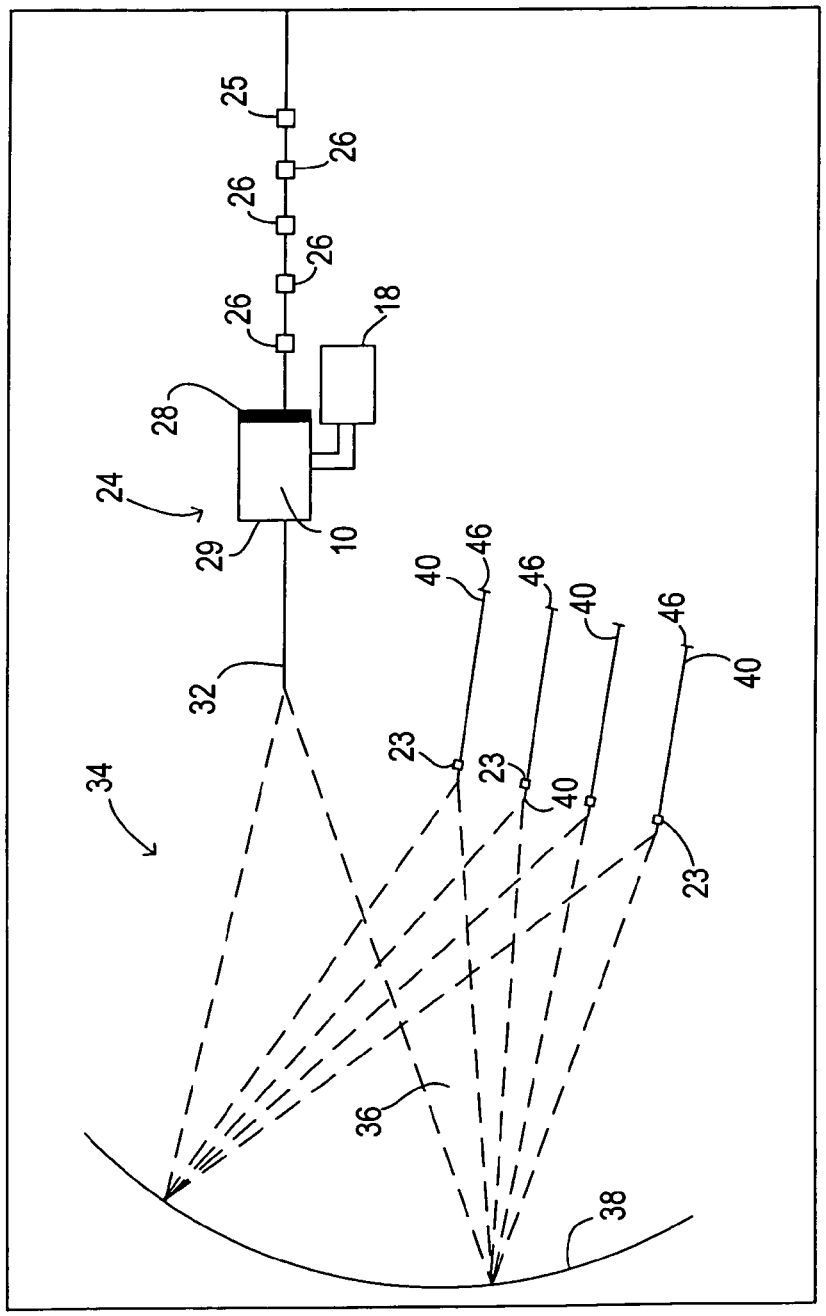
FIG. 3B illustrates a multi-channel device constructed according to FIG. 1B.

FIG. 3B illustrates the multi-channel device of FIG. 3A converted into the multi-channel device of FIG. 1B. For instance, the reflecting surface 28 of FIG. 3A is a partially reflecting surface that serves as the second reflector 14 of FIG. 1B. Additionally, the coupled waveguides 44 are removed and the channel waveguides 40 can terminate at the reflecting device 46 which serves as the first reflector 16 of FIG. 1B. The output waveguides 63 is moved so as to receive the output from the laser cavity and carry that output to the second optical attenuators 24 and the amplifier 25.

The multi-channel device of FIG. 3A and FIG. 3B can be built into a variety of optical component platforms. Suitable optical component platforms include, but are not limited to, a silicon-on-insulator platform. FIG. 4A through FIG. 7F illustrate the various components of the multi-channel device illustrated in FIG. 3A and FIG. 3B on a silicon-on-insulator platform. Accordingly, the components illustrated in FIG. 4A through FIG. 7F can be arranged on a silicon-on-insulator according to FIG. 3A and/or FIG. 3B. As a result, the components illustrated in FIG. 4A through FIG. 7F can be combined so as to form a multi-channel device.

Figure 4A:
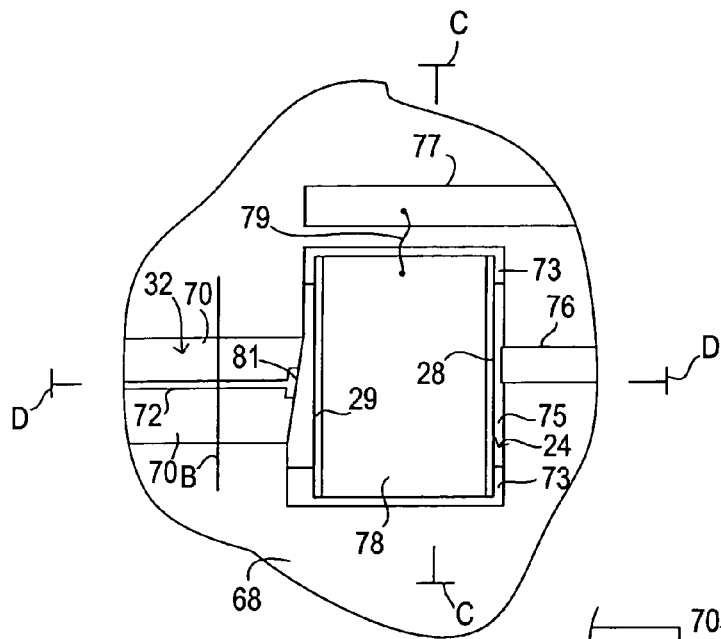
FIG. 4A through FIG. 4D illustrate the portion of a multi-channel device having an interface between a cavity waveguide and a gain element.
Figure 4B:
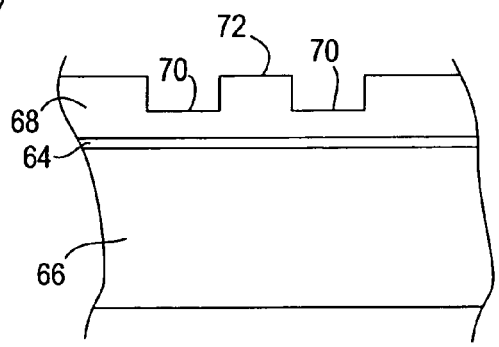

FIG. 4A through FIG. 4D illustrate a portion of a multi-channel device having an interface between a cavity waveguide 32 and a gain element 24. The multi-channel device is constructed on a silicon-on-insulator wafer. FIG. 4A is a topview of the multi-channel device. FIG. 4B is a cross section of the multi-channel device shown in FIG. 4A taken along the line labeled B. The line labeled B extends through the cavity waveguide 32 disclosed in FIG. 3A and FIG. 3B. Accordingly, FIG. 4B is a cross section of the cavity waveguide 32. The silicon-on-insulator wafer includes a silica layer 64 between a silicon substrate 66 and a silicon slab 68. Trenches 70 in the silicon slab 68 define a ridge 72. The ridge 72 and the silica layer 64 define a light signal-carrying region where the light beam is constrained. For instance, the reduced index of refraction of the silica relative to the silicon prevents the light beam from entering the substrate from the silicon. The other waveguides on the multi-channel device have a structure similar to the structure shown in FIG. 4B although they can have different dimensions. For instance, the cavity waveguide 32, the channel waveguides 40, the coupled waveguide 44, the branch waveguides, the modulated waveguide 54, and the output waveguide 63 can each have a structure as illustrated in FIG. 4B.

Figure 4C:
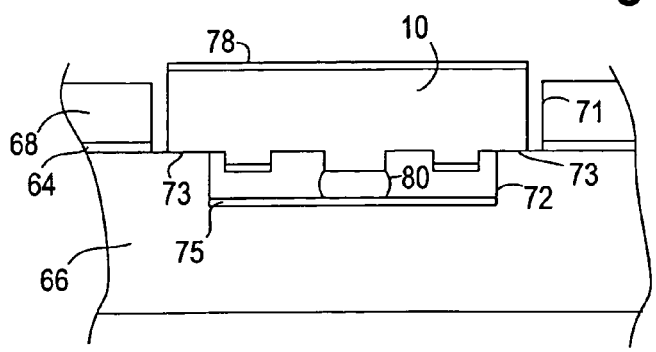
Figure 4D:
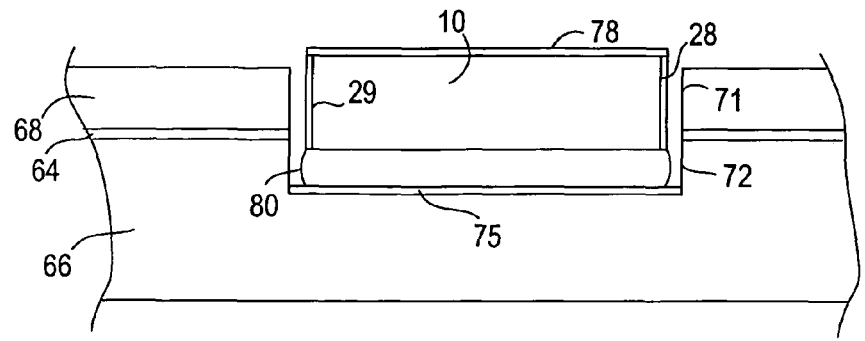

FIG. 4C is a cross section of the multi-channel device shown in FIG. 4A taken along a line extending between the brackets labeled C in FIG. 4A. FIG. 4D is a cross section of the multi-channel device shown in FIG. 4A taken along a line extending between the brackets labeled D in FIG. 4A. A first recess 71 extends into through the silicon slab 68 and the silica layer 64. A second recess 72 extends into the bottom of the first recess 71 such that the silicon substrate 66 forms shelves 73 in the bottom of the second recess 72. A first conducting layer 75 is positioned in the bottom of the second recess 72. A first conductor 76 on the silicon slab 68 is in electrical communication with the first conducting layer 75. A second conductor 77 on the silicon slab 68 is positioned adjacent to the first recess 71.

The gain element 24 is positioned in the first recess 71 and rests on the shelves 73. The gain element 24 includes a gain medium 10. A second conducting layer 78 is positioned on the gain medium 10. A third conductor 79 provides electrical communication between the second conducting layer 78 and the second conductor 77.

Three ridges extending into the second recess 72. The outer-most ridges have a passivation layer. The central ridge is in electrical communication with the first conducting layer 75. The electrical communication between the central ridge and the first conductor 76 can be achieved through a conducting medium 80 such as solder. Since the first conductor 76 is in electrical communication with the first conducting layer 75, the first conductor 76 is in electrical communication with the central ridge.

The beam of light can be generated from the gain medium 10 by causing an electrical current to flow through the gain medium 10. The electrical current can be generated by applying a potential difference between the first conductor 76 and the second conductor 77. The potential difference can be provided by the power source 18 illustrated in FIG. 3A and FIG. 3B. The power source 18 can be included on the multi-channel device or can be separate from the multi-channel device and the multi-channel device can be configured to be electrically coupled with the power source 18.

The gain element 24 includes a reflecting surface on the gain medium 10. The reflecting surface can serve as the second reflector 14 of FIG. 1A or as the reflecting surface of FIG. 3A. Suitable reflecting surfaces include a layer of metal on the layer of gain medium 10. The side of the gain medium 10 opposite the reflecting surface includes an anti-reflective coating 29. The beam of light exits the gain medium 10 through the anti-reflective coating 29.

As is evident from FIG. 4A, the facet 81 for the cavity waveguide 32 can be angled at less than ninety degrees relative to the direction of propagation in the cavity waveguide 32. Angling the facet 81 at less than ninety degrees can cause light signals reflected at the facet 81 to be reflected out of the waveguide and can accordingly reduce issues associated with back reflection.

The trenches 70 for the waveguides can be formed using traditional integrated circuit manufacturing masking and etching steps. The first recess 71 can be formed in a different mask and etch. Further, the second recess 72 can be formed in another mask and etch steps. The first conducting layer 75, the first conductor 76, and the second conductor 77 can be formed using traditional integrated circuit manufacturing techniques for forming metal traces on substrates.

Suitable gain elements 24 include, but are not limited to, InP chips. The electrical communication between the second conducting layer 78 and the second conductor 77 can be achieved using traditional techniques such as wire bonding. The electrical communication between the central ridge and the first conductor 76 can be achieved through traditional techniques such as solder bonding.

The portion of the multi-channel device illustrated in FIG. 4A through FIG. 4D is suitable for use with an electrical power source, however, the illustrations in FIG. 4A through FIG. 4D can be adapted for use with a light source that serves as a power source. The light source can be included on the multi-channel device or can be separate from the multi-channel device.

Figure 5A:
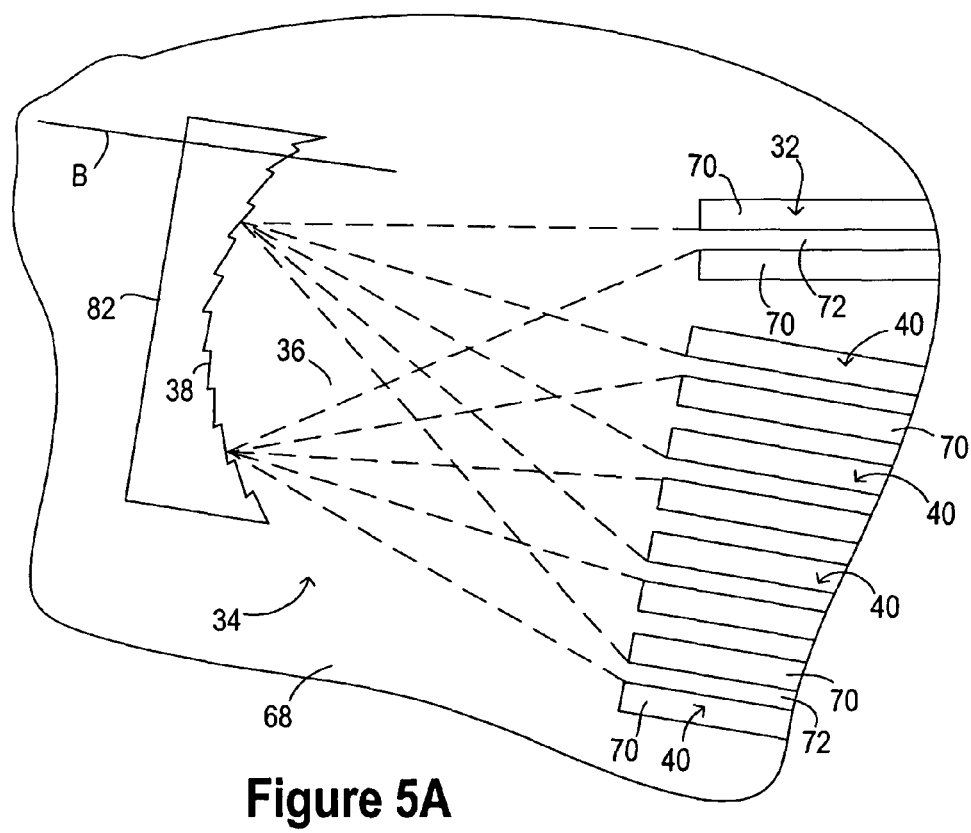
FIG. 5A and FIG. 5B illustrate a portion of a multi-channel device having an interface between an echelle grating, a cavity waveguide, and channel waveguides.
Figure 5B:
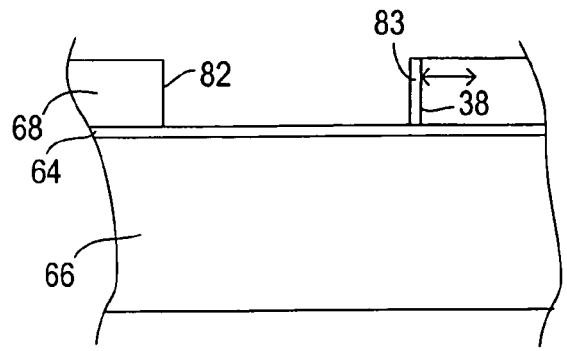

FIG. 5A and FIG. 5B illustrate a portion of a multi-channel device having an interface between an echelle grating 34, a cavity waveguide 32, and channel waveguides 40. The multi-channel device is formed on a silicon-on-insulator wafer. FIG. 5A is a topview of the silicon-on-insulator wafer. FIG. 5B is a cross section taken along the line labeled B in FIG. 5A. As noted in FIG. 3A and FIG. 3B, the echelle grating 34 includes a free space region 36 and a reflecting surface 38. The beam from the cavity waveguide 32 enters the free space region 36 of the echelle grating 34. The path of the light through the echelle grating 34 is illustrated as dashed lines in FIG. 5A in order to distinguish the light from other features. The beam travels through the free space region 36 and is reflected off of the reflecting surface 38. The echelle grating 34 demultiplexes the beam into the individual channels traveling away from the reflecting surface 38.

A reflecting recess 82 extends through the silicon slab 68 to the silica layer 64 and can extend to into or through the silica layer 64. A side of the reflecting recess 82 serves as the reflecting surface 38. The side of the reflecting recess 82 can optionally include a reflecting material 83 to enhance reflection of light from the free space region 36. Suitable reflecting materials 83 include a layer of metal. The reflecting recess 82 can be filled with air or can optionally be filled with a cladding material such as silica.

The channel waveguides 40 and the cavity waveguide 32 shown in FIG. 5A have the same general structure as the cavity waveguide 32 shown in FIG. 4A. For instance, the channel waveguides 40 and the cavity waveguide 32 can have the cross section illustrated in FIG. 4B. As is evident in FIG. 5A, the channel waveguides 40 and the cavity waveguide 32 do not terminate at a facet but instead open up into the free space 36 region of the echelle grating 34.

The trenches 70 for the channel waveguides 40 can be formed concurrently with the trenches 70 for the cavity waveguide 32. The reflecting recess 82 can optionally be masked and etched concurrently with the first recess 71 for the gain element 24 or can be masked and etched in a different step. The reflecting material 83 can be formed in the reflector recess 84 using traditional integrated circuit manufacturing techniques.

The echelle grating 34 of FIG. 5A and FIG. 5B can serve as the multiplexer 22 of FIG. 1A and/or FIG. 1B and/or as the echelle grating 34 of FIG. 3A and FIG. 3B. For instance, the channel waveguides 40 of FIG. 5A can serve as the modulated waveguides 54 and the cavity waveguide 32 can serve as the output waveguide 63. The modulated channels travel from the modulated waveguide 54, through the echelle grating 34, to the output waveguide 63. The output waveguide 63 can have the same general structure as the channel waveguide 40, the first branch waveguide 52, the second branch waveguide 53, the modulated waveguides 54, and/or the cavity waveguide 32. For instance, the output waveguide 63 can have the cross section illustrated in FIG. 4B. The trenches 70 for the output waveguide 63 can be masked and etched concurrently with the trenches 70 for the channel waveguide 40, the first branch waveguide 52, the second branch waveguide 53, the modulated waveguides 54, and/or the cavity waveguide 32.

Figure 6A:
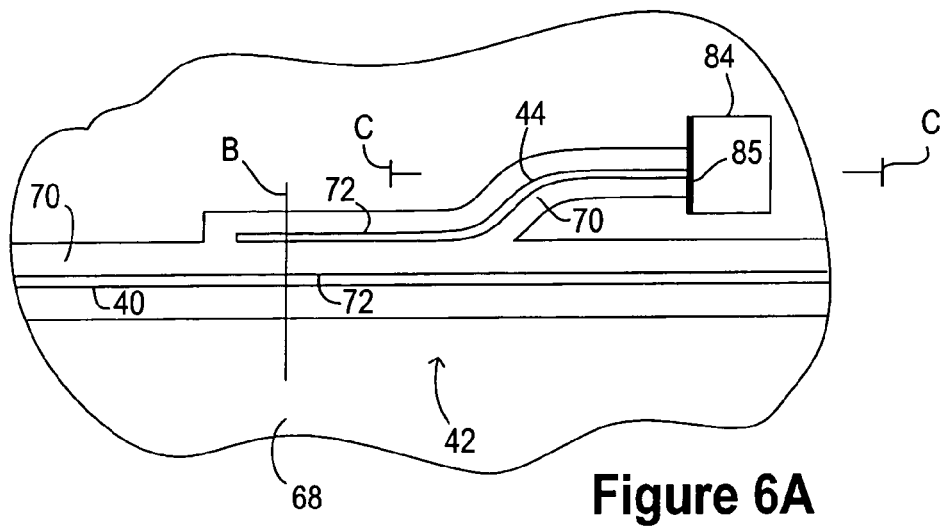
FIG. 6A through FIG. 6C illustrate a portion of a multi-channel device having an optical coupler.
Figure 6B:
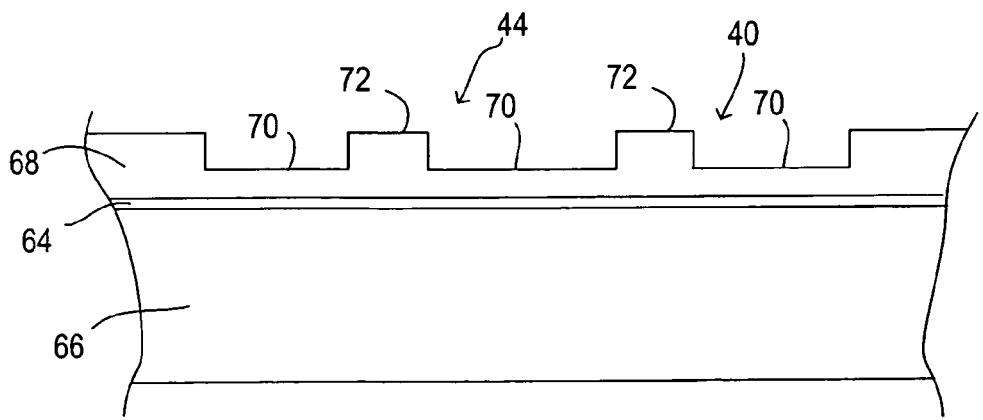
Figure 6C:
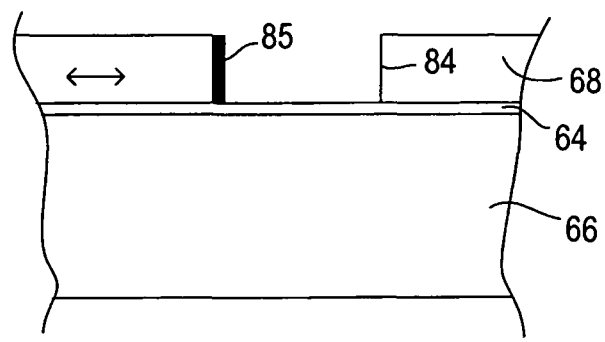

FIG. 6A through FIG. 6C illustrate the portion of a multi-channel device having an optical coupler 42 that can serve as a first reflector. The multi-channel device is constructed on a silicon-on-insulator wafer. Each of the optical couplers 42 illustrated in FIG. 3A can be constructed according to FIG. 6A through FIG. 6C. FIG. 6A is a topview of the multi-channel device. The coupler 42 includes a channel waveguide 40 and a coupled waveguide 44. FIG. 6B is a cross section of the coupled waveguide and the channel waveguide 40 taken along the line labeled B in FIG. 6A. The ridge 72 for the coupled waveguide 44 is close enough to the ridge 72 for the channel waveguide 40 for the channel waveguide 40 and the coupled waveguide 44 to physically share a channel as it travels along the channel waveguide 40. Accordingly, a portion of the channel transfers into the coupled waveguide 44 before the ridge 72 of the coupled waveguide 44 and the ridge 72 of the channel waveguide 40 physically separate as shown in FIG. 5A.

FIG. 6C is a cross section of the coupled waveguide 44 taken along a line between the brackets labeled C in FIG. 6A. The coupled waveguide 44 terminates at a reflector recess extending through the silicon slab 68 to or into the silica layer 64. A side of the reflector recess 84 serves as a reflecting surface. The reflecting surface serves as the reflecting device 46 disclosed in the context of FIG. 3A and FIG. 3B. The side of the reflector recess 84 can optionally include a reflecting material 85 to enhance reflection of light back through the coupled waveguide 44. Suitable reflecting materials 85 include a layer of metal. The reflector recess 84 can be filled with air or can optionally be filled with a cladding material such as silica.

The trenches 70 for the channel waveguides 40 and the coupled waveguides 44 can be formed concurrently with the trenches 70 for the cavity waveguide 32. The reflector recess 84 can optionally be masked and etched concurrently with the first recess 71 for the gain element 24 and/or with the reflecting recess 82 for the echelle grating 34. Alternately, the reflector recess 84 can be masked and etched in a different step. The reflecting material 85 can be formed in the reflector recess 84 using traditional integrated circuit manufacturing techniques.

Figure 7A:
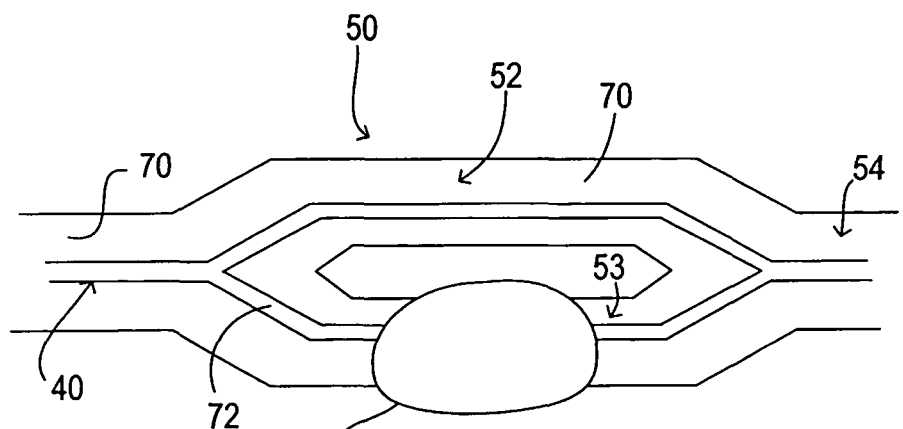
FIG. 7A through FIG. 7E illustrate a portion of a multi-channel device having a Mach-Zehnder interferometer configured to operate as an intensity modulator.

FIG. 7A through FIG. 7E illustrate a portion of a multi-channel device having a Mach-Zehnder interferometer configured to operate as an intensity modulator. The multi-channel device is constructed on a silicon-on-insulator wafer. FIG. 7A is a topview of the Mach-Zehnder interferometer. The Mach-Zehnder interferometer includes a channel waveguide 40 that branches into a first branch waveguide 52 and a second branch waveguide 53. The first branch waveguide 52 re-joins the second branch waveguide 53 at a modulated waveguide 54.

The channel waveguide 40, the first branch waveguide 52, the second branch waveguide 53 and the modulated waveguide 54 have the same general structure as the cavity waveguide 32 shown in FIG. 4A. For instance, the channel waveguide 40, the first branch waveguide 52, the second branch waveguide 53 and the modulated waveguide 54 can have the cross section illustrated in FIG. 4B. The trenches 70 for the channel waveguide 40, the first branch waveguide 52, the second branch waveguide 53 and/or the modulated waveguide 54 can be masked and etched concurrently with the trenches 70 for the cavity waveguide 32.

Figure 7B:
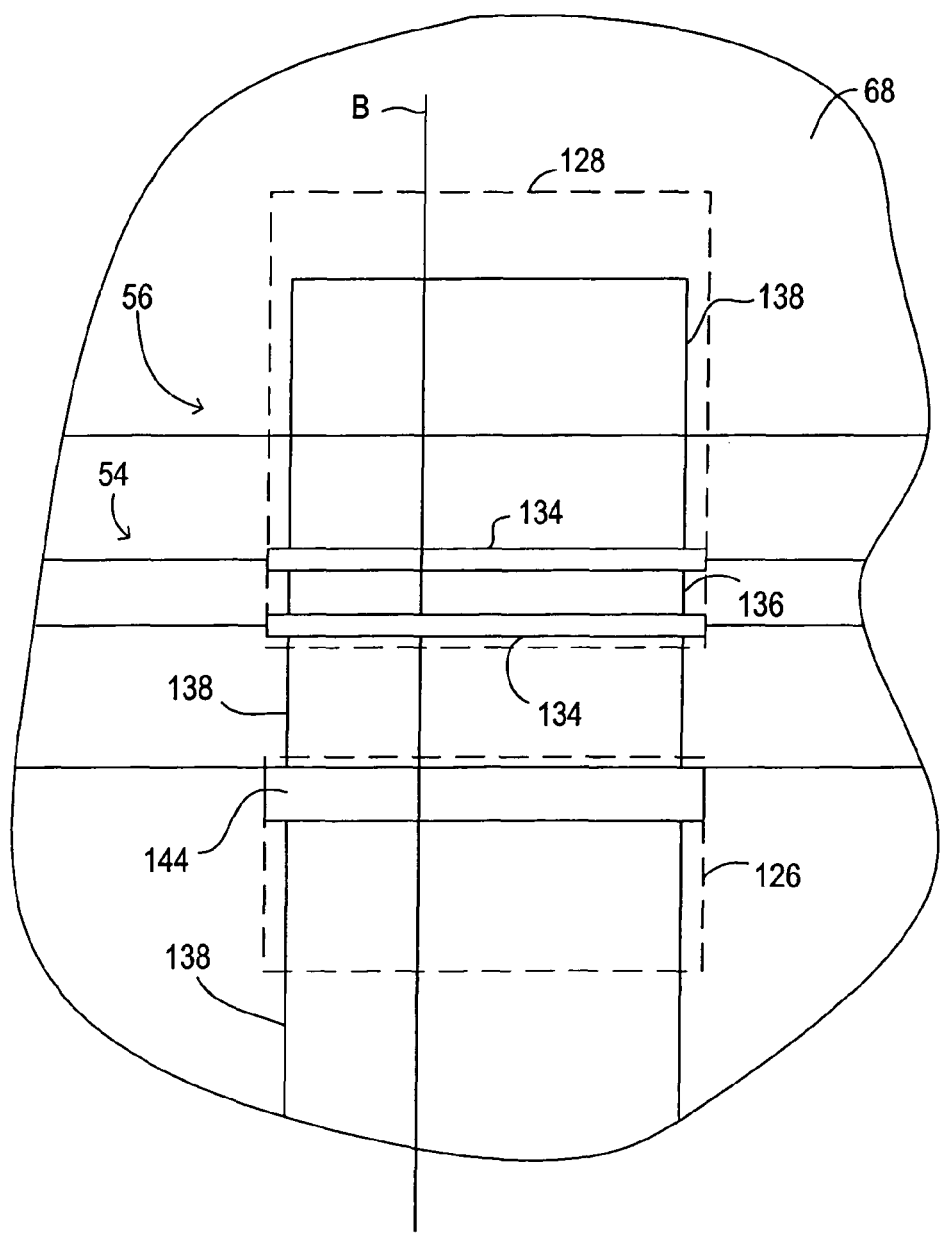
Figure 7C:
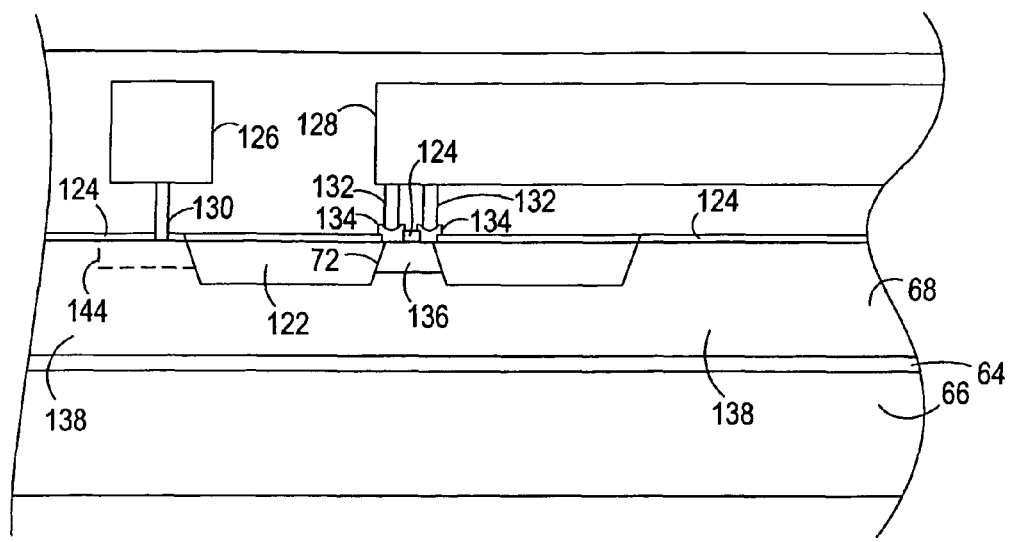

A phase modulator 56 is positioned along the second branch waveguide 53. FIG. 7B is a topview of a phase modulator 56 that is suitable for use with the Mach-Zehnder interferometer of FIG. 7A. FIG. 7C is a cross section of the phase modulator 56 shown in FIG. 7B taken along the line labeled C in FIG. 7B. A filler 122 such as a solid or a gas is positioned in the trenches 70 that define the second branch waveguide 53. The filler 122 has an index of refraction lower than the index of refraction of the silicon in order to constrain the light signals within the ridge 72. The filler can also provide electrical isolation between different regions of the phase modulator. For instance, the filler can provide electrical isolation between the first doped region and the second doped region, which are discussed in more detail below. A suitable filler 122 includes, but is not limited to, silica. A vacuum can also serve as a suitable filler 122.

An insulating layer 124 is positioned on the light-transmitting medium 10 and the filler 122. The insulating layer is illustrated in FIG. 7C but is not illustrated in FIG. 7B to simplify the illustration. The insulating layer 124 can provide electrical insulation and/or optical confinement. A suitable insulating layer 124 includes, but is not limited to, low K dielectrics such as silica, and/or silicon nitride. In one example, the insulating layer 124 includes a silicon nitride and oxide bi-layer over silicon.

An upper layer 125 is positioned on the insulating layer 124. The upper layer 125 is illustrated in FIG. 7C but is not illustrated in FIG. 7B to simplify the illustration. The upper layer 125 can serve to reduce or prevent capacitive coupling between different components in the device. For instance, the upper layer 125 can prevent or reduce capacitive coupling between a first conducting member 126 and a second conducting member 128 that are disclosed in more detail below. A suitable upper layer includes, but is not limited to, low K dielectrics such as silica.

The phase modulator includes a first conducting member 126 and a second conducting member 128 as is evident in both FIG. 7B and FIG. 7C. In FIG. 7B, the first conducting member 126 and the second conducting member 128 are illustrated by dashed lines and are shown as transparent to permit a view of the underlying features. The first conducting member 126 and the second conducting member 128 can serve as electrodes but more preferably serve as transmission lines. Suitable materials for the first conducting member 126 include, but are not limited to, aluminum, copper and/or their alloys. Suitable materials for the second conducting member 128 include, but are not limited to, aluminum, copper and/or their alloys.

A first electrical connector 130 provides electrical communication between the first member 126 and a contact portion of the silicon slab 68 located adjacent to the waveguide and spaced apart from the waveguide. Second electrical connectors 132 provide electrical communication between contacts 134 at the top of the ridge 72 and the second member 128. The first electrical connector 130 and the second electrical connectors 132 are illustrated in FIG. 7C but are not illustrated in FIG. 7B to simplify the illustration. The first electrical connectors, the second electrical connectors and the contacts provide electrical connections between electronics and the optics. Suitable materials for the first electrical connector 130 include, but are not limited to, tungsten, aluminum, copper and/or their alloys. Suitable materials for the second electrical connector 132 include, but are not limited to, tungsten, aluminum, copper and/or their alloys. Suitable materials for the contacts 134 include, but are not limited to, Al—Si alloys, Ti silicide, and Co silicide.

In some instances, the contacts 134 are a doped non-metal such as doped silicon or doped polysilicon. Doped polysilicon can provide the required electrical conduction but can have about two orders of magnitude fewer carriers than the metal. Because increased carrier content is associated with increased light absorption, contacts 134 constructed from doped silicon can be associated with reduced levels of optical loss relative to metals. As a result, contacts 134 constructed of doped silicon or polysilicon may be desired when low levels of optical loss are desired. When the contacts 134 are made of polysilicon, a suitable concentration of the dopant includes, but is not limited to, concentrations of about $10^{18}/cm^3$ to $2 \times 10^{21}/cm^3$ or $10^{19}/cm^3$ to $2 \times 10^{20}/cm^3$.

The silicon is doped so as to have a first doped region 136 and a second doped region 138. When the first doped region 136 is an n-type region, the second dope region is a p-type region. When the first doped region 136 is a p-type region, the second dope region is an n-type region. In some instances, the first doped region is preferably an n-type region and the second doped region is preferably a p-type region. For instance, certain fabrication techniques may permit easier formation of a p-type region deeper in the light transmitting medium that an n-type region. When the contacts 134 are formed of a doped non-metal, the non-metal is doped with the same type of dopant as the first doped region 136 but can be at a higher dopant concentration than the first doped region 136.

The first doped region 136 and the second doped region 138 are positioned sufficiently close to one another that a depletion region 140 forms between the n-type region and the p-type region when a bias is not applied to the phase modulator. For instance, FIG. 1B illustrates the n-type region in contact with the p-type region. Contact between the n-type region and the p-type region may not be necessary although it can increase the efficiency of the modulator. The resulting interface is substantially parallel to the top of the ridge 72 and/or the silicon substrate 66 and is positioned in the ridge 72.

The depletion region 140 results from a migration of carriers between the n-type region and the p-type region until a potential forms that prevents additional migration. This migration results in a lack of carriers in the depletion region. For instance, the depletion region 140 has a carrier concentration of less than about $1 \times 10^{15}/cm^3$. The n-type region and a p-type region are positioned so the depletion region 40 is positioned in the light signal-carrying region of the waveguide. For instance, FIG. 1C illustrates the depletion region 140 that forms from the doped region configuration illustrated in FIG. 1B. A suitable concentration of carriers in the p-type region includes values greater than $1 \times 10^{15}/cm^3$, $1 \times 10^{16}/cm^3$, $3.5 \times 10^{16}/cm^3$, or $5.0 \times 10^{17}/cm^3$. A suitable value for the concentration of carriers in the n-type region includes values greater than $1 \times 10^{15}/cm^3$, $2 \times 10^{16}$, $5 \times 10^{16}$, and $1 \times 10^{18}$ $cm^{-3}$.

A secondary doped region 144 is formed at the contact portion of the silicon slab 68. The secondary doped region 144 can contact the adjacent doped region and can include the same type of dopant as the adjacent doped region. For instance, in FIG. 7C, the underlying doped region is the second doped region 138. Accordingly, when the phase modulator is constructed as illustrated in FIG. 7C, the secondary doped region 144 can contact the second doped region and has a dopant type that is the same as the second doped region 138. The secondary doped region 144 can have a higher dopant concentration than the adjacent doped region. For instance, the dopant concentration in the secondary doped region 144 can be more than 10 times the dopant concentration in the adjacent doped region or more than 1000 times the dopant concentration in the adjacent doped region. The elevated dopant concentration reduces the contact resistance of the phase modulator and accordingly provides an increased modulation speed. Suitable concentrations for the dopant in the secondary doped region 144 include, but are not limited to, concentrations greater than $1\times10^{18}/cm^3$, $1\times10^{19}/cm^3$, $5\times10^{19}/cm^3$, $1\times10^{20}/cm^3$. Increasing the dopant concentration can increase the amount of optical loss. As a result, the secondary doped region 144 is positioned remote from the light signal-carrying region in order to reduce optical loss resulting from the increased dopant concentration. For instance, the secondary doped region 144 is positioned on a portion of the silicon slab 68 adjacent to the trench 70. This location can reduce interaction between a light signal in the waveguide and the secondary doped region 144. In some instances, the secondary doped region 144 can be positioned in the trench 70 or in the bottom of the trench 70.

Figure 7D:
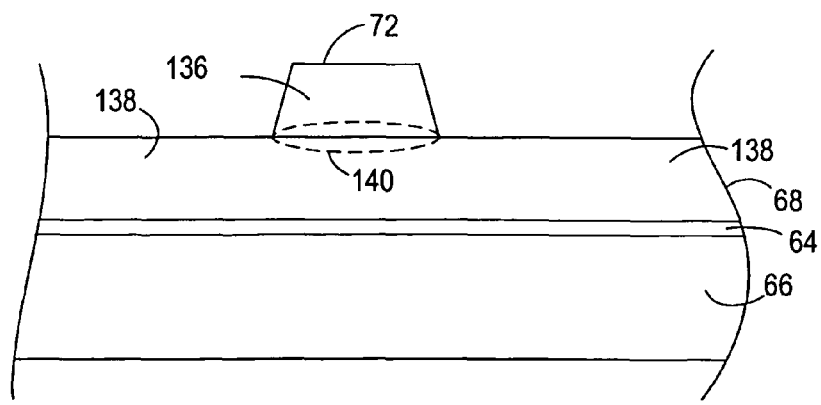
Figure 7E:
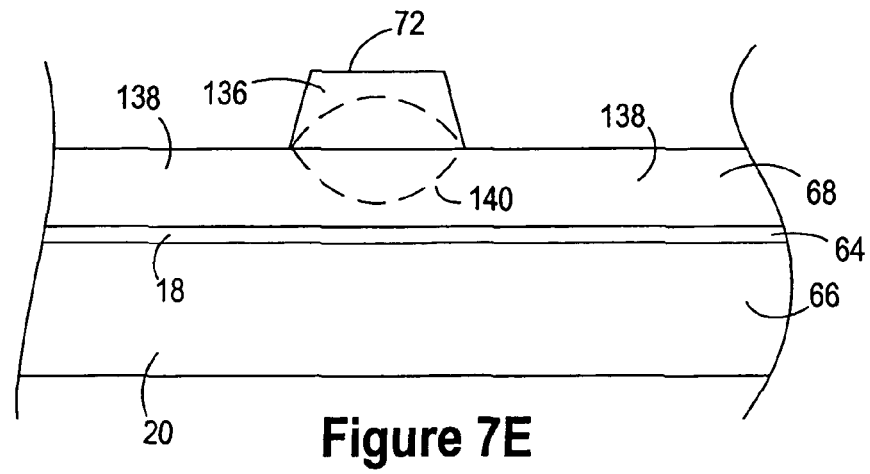

The first member 126 and the second member 128 are connected to electronics (not shown) that can apply a bias between the first conducting member 126 and the second conducting member 128. Accordingly, a bias is formed between the top of the ridge 72 and the contact portion of the silicon slab 68. The bias can be a reverse bias. Changing the level of bias changes the size and/or shape of the depletion region. For instance, increasing the reverse bias can increase the size of the depletion region. As an example, FIG. 7E illustrates the depletion region of FIG. 7D after an increased reverse bias has been applied to the phase modulator. FIG. 7C, FIG. 7D and FIG. 7E illustrate the first doped region and the second doped region occupying the entire light signal carrying region. This arrangement can provide an increased potential tuning efficiency.

The depletion region 140 has a different index of refraction than the light transmitting region located adjacent to the depletion region. For instance, when the light-transmitting medium 110 is silicon, the depletion region 140 has a higher index of refraction than that of the surrounding silicon. As a result, the depletion region 140 slows the light signal as the light signal travels through the depletion region. As a result, increasing the size of the depletion region 140 further slows the speed at which the light signal travels through the waveguide. Accordingly, the speed of the light signal through the waveguide can be tuned by tuning the bias level. Additionally, because this phase tuning is based on tuning of the depletion region, tuning of the phase modulator does not involve carrier re-combination. Carrier recombination is on the order of 1000 times slower than changes in the depletion region. Accordingly, the phase modulator can be on the order of 1000 to 10000 times faster than phase modulators that require carrier recombination.

A forward bias can be applied to the phase modulator. The forward bias will shrink the size of the depletion region. Accordingly, increasing the forward bias can accelerate the light signal. However, once the forward bias rises above a threshold, the forward bias can result in current flow that requires recombination as the forward bias drops toward the threshold. Because tuning that requires recombination is slower than tuning of the depletion region, it may not be desirable to use the forward bias above levels where significant current flow occurs.

The concentration of the dopants in the doped regions influences the performance of the phase modulator. For instance, the dopants can cause light absorption. As a result, increasing the dopant level can cause undesirably high levels of optical loss. Decreasing the dopant level can reduce the tuning efficiency by requiring a higher bias level to achieve the same level of phase modulation. As a result, when the dopant level is reduced, the length of the phase modulator must be increased to provide the desired level of phase modulation for a give bias level. Suitable dopants for the n-type region include, but are not limited to, phosphorus and/or arsenic. Suitable dopants for the p-type regions include, but are not limited to, boron.

Although FIG. 7C illustrates the interface between the first doped region 136 and the second doped region 138 as being positioned in the ridge 72, first doped region 136 and the second doped region 138 can be constructed so the interface is below the ridge 72. In these instances, the doped region in the ridge 72 and the secondary doped region 144 may be the same type of doped region. For instance, the doped region in the ridge 72 and the secondary doped region 144 may both be an n-type region or they may both be a p-type region.

In some instances, it is desirable for an intensity modulator such as a Mach-Zehnder interferometer to provide intensity modulation on the order of 10 to 40 Gbit/s with low levels of optical loss. Accordingly, the high-speed features of the phase modulator can be important when the phase modulator is employed for intensity modulation. Additionally, the low optical loss features of the phase modulator can also become desirable when the phase modulator is employed for intensity modulation.

Figure 7F:
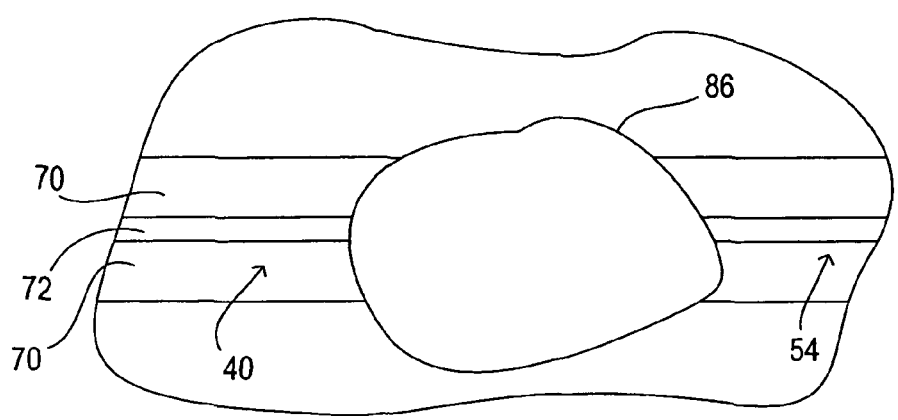
FIG. 7F illustrates the phase modulator of FIG. 7B through FIG. 7E substituted for the intensity modulator illustrated in FIG. 7A.

In some instances, it may be preferable for the modulator to be a phase modulator rather than an intensity modulator. For instance, FIG. 7F illustrates the phase modulator of FIG. 7B through FIG. 7E substituted for the intensity modulator illustrated in FIG. 7A. In FIG. 7F, the first branch waveguide 52 and the second branch waveguide 53 are eliminated and the channel waveguide 40 is connected directly to the modulated waveguide 54. The phase modulator is positioned at the intersection of the channel waveguide 40 and the modulated waveguide 54.

Additional information regarding the structure, fabrication, and operation of a high speed intensity modulator are provided in U.S. patent application Ser. No. 11/146,898, filed on Jun. 7, 2005, entitled "High Speed Optical Phase Modulator" and in U.S. patent application Ser. No. 11/147,403, filed on Jun. 7, 2005, entitled "High Speed Optical Intensity Modulator," each of which is incorporated herein in its entirety. Additionally, U.S. patent application Ser. Nos. 11/146,898 and 11/147,403 provide additional embodiments for phase and intensity modulators that can be employed as modulators in the multi-channel device disclosed above.

The filler 122, the upper layer 125, and the insulating layer 124 that are present in FIG. 7C are not shown in FIG. 4A through FIG. 6C. The filler 122, the upper layer 125, and the insulating layer 124 can be localized to the modulator. Alternately, the upper layer 125 and the insulating layer 124 can be positioned on the exposed silicon slab 68 and the filler 122 can be positioned in the trenches 70 of FIG. 4A through FIG. 6C.

Figure 8:
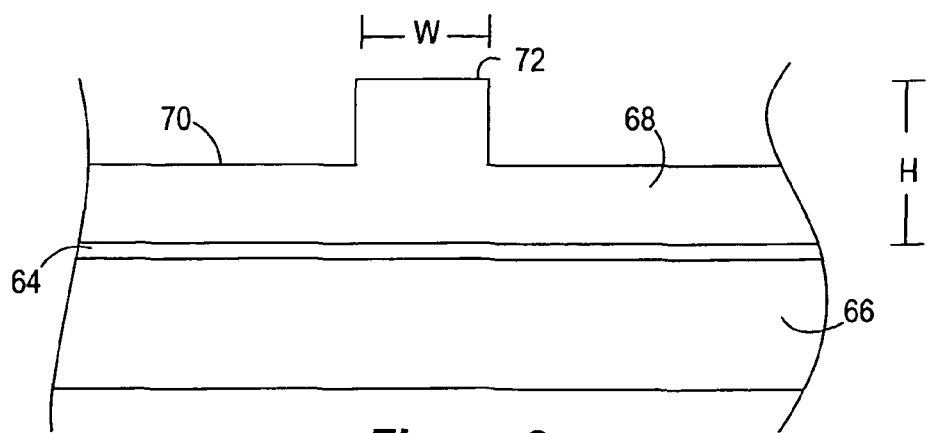
FIG. 8 is a cross section of a waveguide on a silicon-on-insulator wafer. The waveguide has a width labeled W. The width is the width of the ridge at the top of the ridge. The waveguide also has a thickness labeled H.

FIG. 8 is a cross section of a waveguide on a silicon-on-insulator wafer. As noted above, the cavity waveguide 32, the channel waveguides 40, the coupled waveguide 44, the first branch waveguides 52, the second branch waveguides 53, the modulated waveguides 54 can each have a structure according to FIG. 8. The waveguide has a width labeled W. The width is the width of the ridge at the top of the ridge. The waveguide also has a thickness labeled H. The thickness is the thickness of the silicon where the light signal is carried. For instance, the thickness extends from the top of the silica layer 64 to the top of the ridge. The cross sectional area of the waveguide is equal to the width, W, multiplied by the thickness, H. The light signal may extend outside of this cross sectional area as the light signal travels through the waveguide. The intensity modulator and the phase modulator illustrated in FIG. 7A through FIG. 7E is more efficient and faster as the waveguide cross-section decreases. In one example, the first branch waveguide 52 and the second branch waveguide 53 have a cross sectional area of about 1 $\mu m^2$.

An echelle grating such as the echelle grating 34 illustrated in FIG. 3A and FIG. 3B has more loss as the thickness of the echelle grating increases. The thickness is the thickness of the silicon where the light signal is carried. Accordingly, the thickness is the can be from the top of the silica to the top of the silicon slab 68 in the free space region.

In some instances, the cavity waveguide 32, the channel waveguides 40, the first branch waveguides 52, the second branch waveguides 53, the modulated waveguides 54 all have about the same cross-sectional dimensions but the output waveguide 63 have larger cross-sectional dimensions. This arrangement permits the modulators and echelle gratings to have the dimensions that are desired for efficient operation of the echelle grating and the modulators while permitting the output waveguide 63 to have the dimensions desired for other applications.

Figure 9A:
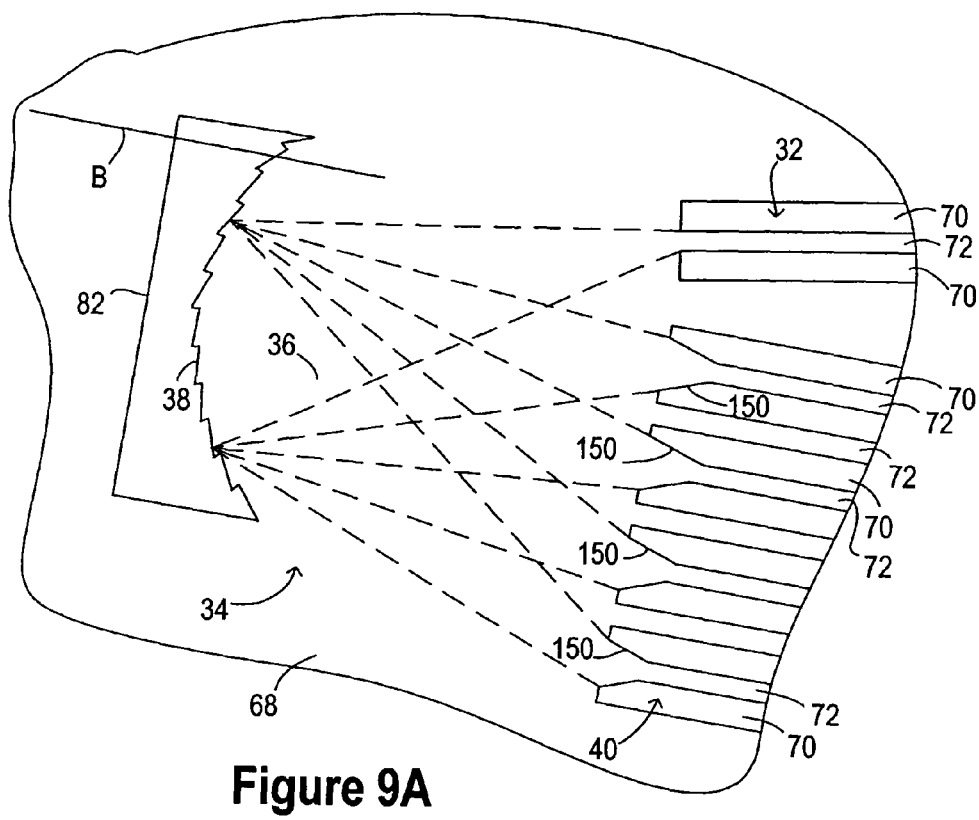
FIG. 9A is a topview of a portion of the multi-channel device having an interface between an echelle grating, a cavity waveguide, and a channel waveguides. The channel waveguides each include a taper.

In some instances, waveguide tapers can be employed to vary the cross-sectional dimensions of the waveguides. For instance, FIG. 9A is a topview of the interface between the echelle grating, the cavity waveguide 32, and the channel waveguides 40 on a silicon-on-insulator wafer. The channel waveguides 40 include a horizontal taper 150. The taper 150 can reduce the cross-sectional dimension of the channel waveguides 40 to dimensions that are suitable for efficient operation of the modulators. Each taper 150 can have a horizontal taper 150 without a vertical taper, or can have a vertical taper and horizontal taper. Although FIG. 9A illustrates the tapers 150 as having a horizontal taper, the tapers can have vertical taper without horizontal taper.

Figure 9B:
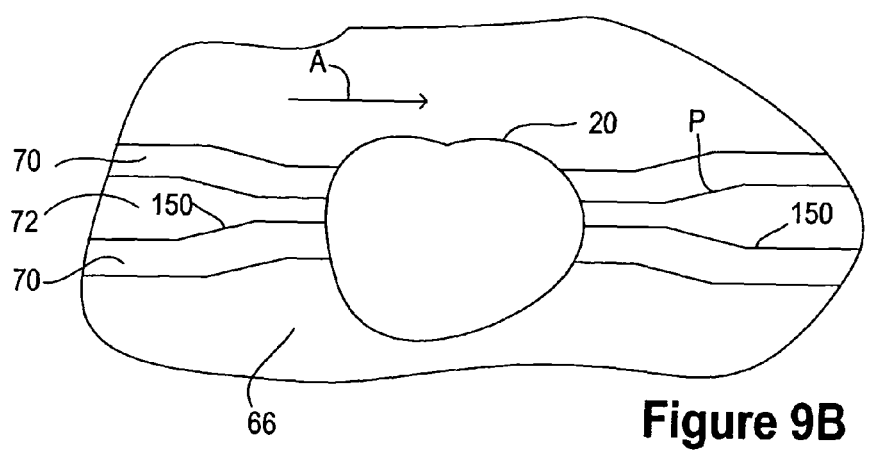
FIG. 9B is a topview of a portion of a multi-channel device having a modulator positioned between waveguide tapers.

In addition to the tapers illustrated in FIG. 9A or as an alternative to the tapers illustrated in FIG. 9A, tapers 150 can be employed in conjunction with the modulator. For instance, FIG. 9B illustrates the modulator positioned between tapers 150. The direction of the channels through the modulator and the tapers is illustrated by the arrow labeled A. Each taper can have a horizontal taper without a vertical taper, or can have a vertical taper and horizontal taper. Although FIG. 9A illustrates the tapers as having a horizontal taper, the tapers can have vertical taper without horizontal taper. The taper can reduce the cross-sectional dimension of the channel waveguides 40 to dimensions that are suitable for efficient operation of the modulators. In some instances, one of the tapers is not employed. For instance, the taper labeled P need not be employed. In the instances where the tapers labeled P are not employed, the cross-sectional dimensions of the output waveguide 63 can be larger than the cross-sectional dimensions of the modulated waveguide 54. As a result, the multiplexer provides the expansion of the cross-sectional dimensions that was previously provided by the taper labeled P.

The modulator illustrated in FIG. 9B can be the modulator of FIG. 1A and FIG. 1B. For instance, the modulator can be the intensity modulator of FIG. 7A, the phase modulator of FIG. 7B, or the phase modulator of FIG. 7F. Further, the modulator can be a phase modulator of FIG. 7B included in an intensity modulator of FIG. 7A.

Suitable structures for the tapers and methods for fabricating the tapers are provided in U.S. patent application Ser. No. 10/345,709, filed on Jan. 15, 2003, entitled "Controlled Selectivity Etch for Use with Optical Component Fabrication," and incorporated herein in its entirety. The disclosed structures and methods can be employed for the tapers illustrated in FIG. 9A and FIG. 9B.

As noted above in the context of FIG. 1C, the multi-channel device can be constructed such that one or more multiplexers multiplexes channels from two or more laser cavities. When one or more multiplexers multiplex the channels from different laser cavities, the different laser cavities and the multiplexer can be included on the same multi-channel device. For instance, the different laser cavities and the multiplexer can be included on the same wafer. For instance, the different laser cavities and the multiplexer can be included on a silicon-on-insulator wafer.

Although the multi-channel device is disclosed in the context of a silicon-on-insulator wafer, the multi-channel device can be built into other platforms. Additionally, the multi-channel device is disclosed in the context of ridge waveguides. However, the multi-channel device can be constructed using other waveguides including, but not limited to, buried channel waveguides 40.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A multi-channel optical device, comprising:
a quantum dot gain medium in a laser cavity, the quantum dot gain medium being configured to produce a light beam,
the quantum dot gain medium including quantum dots, and the quantum dots in the gain medium having a variety of different radii; and
a demultiplexer in the laser cavity, the demultiplexer configured to demultiplex the light beam into a plurality of channels that are each at a different wavelength, the demultiplexer selecting wavelengths of the channels, and the radii of the quantum dots being selected such that the wavelengths selected by the demultiplexer are each associated with one of the quantum dot radii.

2. The device of claim 1, further comprising:
a plurality of ports, each channel exiting the laser cavity through a different one of the ports.

3. The device of claim 1, further comprising:
a plurality of channel waveguides that are each configured to receive one of the channels, each channel waveguide including one of the ports.

4. The device of claim 3, wherein each channel waveguide is included in an optical coupler, each optical coupler including a coupled waveguide optically coupled with one of the channel waveguides such that a portion of a channel traveling along the coupled channel waveguide enters the coupled waveguide.

5. The device of claim 4, wherein the coupled waveguides include a reflector configured to reflect at least a portion of the channel that enters the coupled waveguide back onto the coupled channel waveguide.

6. The device of claim 5, wherein the reflector is positioned at a terminal end of the coupled waveguide.

7. The device of claim 6, wherein the reflector includes a reflecting material positioned at the terminal end of the coupled waveguide.

8. The device of claim 4, further comprising:
a plurality of modulators that are each configured to modulate a channel traveling along one of the channel waveguides after the channel has passed through the optical coupler, modulation of each channel resulting in a modulated channel.

9. The device of claim 8, wherein each modulator includes a phase modulator configured to modulate a phase of a channel traveling along one of the channel waveguides.

10. The device of claim 9, wherein the phase modulators each include an n-type region having a proximity to a p-type region that causes a depletion region to form when a bias is not applied to the phase modulator, the depletion region being at least partially positioned in a light signal carrying region of the waveguide.

11. The device of claim 8, wherein each modulator includes a Mach-Zehnder interferometer with a plurality of branch waveguides and a phase modulator configured to modulate a phase of a channel traveling through one of the branch waveguides.

12. The device of claim 8, wherein each modulator includes a phase modulator positioned along a branch waveguide of a Mach-Zehnder interferometer, the phase modulator including an n-type region having a proximity to a p-type region that causes a depletion region to form when a bias is not applied to the modulator, the depletion region being at least partially positioned in a light signal carrying region of the waveguide.

13. The device of claim 8, further comprising:
a multiplexer configured to receive a modulated channel from each of the modulators and to multiplex the modulated channels into a beam having a plurality of modulated channels.

14. The device of claim 1, wherein the laser cavity excludes attenuators that each attenuates an intensity of a different one of the channels.

15. The device of claim 1, wherein the quantum dots of a particular radii are each associated with a different gain peak in an intensity versus wavelength spectrum for the output of the quantum dot gain medium, and
the demultiplexer is constructed such that the wavelengths of a portion of the channels do not correspond to a wavelength of one of the gain peaks.

16. The device of claim 1, wherein the wavelengths selected by the demultiplexer are each associated with a different one of the quantum dot radii.

17. The device of claim 1, wherein the wavelength of each channel is associated with the quantum dot radii that is the dominant source of light having the wavelength of the channel.

18. The device of claim 1, further comprising:
partial return devices that each receives one of the channels, each of the partial return devices configured to transmit a portion of the
received channel such that the transmitted portion exits the laser cavity, and each of the partial return devices configured to return a portion of the received channel; and
wherein the gain medium receives the returned portions of the channels.

19. The device of claim 1, wherein the laser cavity excludes attenuators that each attenuates an intensity of a different one of the channels.

20. The device of claim 19, wherein the quantum dots of a particular radii are each associated with a different gain peak in an intensity versus wavelength spectrum for the output of the quantum dot gain medium, and
the wavelengths selected by the demultiplexer are matched to the gain peaks of the gain medium in that the wavelength of each of the channels is at one of the gain peaks.

* * * * *